United States Patent

Yano et al.

(10) Patent No.: US 6,387,712 B1
(45) Date of Patent: May 14, 2002

(54) PROCESS FOR PREPARING FERROELECTRIC THIN FILMS

(75) Inventors: Yoshihiko Yano, Kanagawa; Takao Noguchi, Chiba, both of (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/453,505

(22) Filed: Dec. 3, 1999

Related U.S. Application Data

(62) Division of application No. 08/883,456, filed on Jun. 26, 1997.

(30) Foreign Application Priority Data

Jun. 26, 1996 (JP) .............................. 8-186625

(51) Int. Cl.$^7$ .............................. H01L 21/00
(52) U.S. Cl. .................. 438/3; 438/763; 438/792; 438/909
(58) Field of Search ............................ 438/3, 763, 792, 438/909

(56) References Cited

U.S. PATENT DOCUMENTS

| | | | |
|---|---|---|---|
| 5,308,462 A | 5/1994 | Iijima et al. | 204/192.15 |
| 5,440,125 A | 8/1995 | Hennins et al. | 250/338.1 |
| 5,554,866 A | 9/1996 | Nishioka et al. | 257/295 |
| 5,567,979 A | 10/1996 | Nashimoto et al. | 257/627 |
| 5,578,845 A | 11/1996 | Masuda et al. | 257/295 |
| 5,719,417 A | 2/1998 | Roeder et al. | 257/295 |
| 5,753,934 A * | 5/1998 | Yano et al. | 257/30 |
| 5,801,105 A | 9/1998 | Yano et al. | |
| 5,810,923 A | 9/1998 | Yano et al. | |
| 5,828,080 A | 10/1998 | Yano et al. | |
| 5,850,089 A * | 12/1998 | Varshney et al. | 257/295 |
| 5,919,515 A | 7/1999 | Yano et al. | |
| 5,955,213 A | 9/1999 | Yano et al. | |
| 5,985,404 A | 11/1999 | Yano et al. | |

FOREIGN PATENT DOCUMENTS

| | | |
|---|---|---|
| JP | 59-138004 Abs | 8/1984 |
| JP | 60-172103 Abs | 9/1985 |
| JP | 61-285609 Abst | 12/1986 |
| JP | 62-252005 Abs | 11/1987 |
| JP | 62-252006 Abst | 11/1987 |
| JP | 3-33680 Abst | 5/1991 |
| JP | 3-35249 Abs | 5/1991 |
| JP | 3-245406 Abst | 11/1991 |
| JP | 3-271360 Abst | 12/1991 |
| JP | 4-199745 Abs | 7/1992 |

(List continued on next page.)

OTHER PUBLICATIONS

Ueno et al., "Preparation of Lead Titanate Films Utilizing self–Control Mechanism of Stoichiometric Composition in Dual–Beam Vacuum Evaporation method", Jpn. J. Appl. Phys., Part 1 (1992), 31(9B), p2982–2984.*

Auciello et al., "Synthesis and Characterization of Lead Zirconate Titanate Thin Films Produced by an Automated laser Ablation Deposition technique", J. Appl. Phys, (1993), 73(10, pt. 1), 5197–207.*

(List continued on next page.)

Primary Examiner—Charles Bowers
Assistant Examiner—Asok Kumar Sarkar
(74) Attorney, Agent, or Firm—Oblon, Spivak, McClelland, Maier & Neustadt, P.C.

(57) ABSTRACT

In a film structure comprising a ferroelectric thin film formed on a substrate, the ferroelectric thin film contains a rare earth element (Rn), Pb, Ti, and O in an atomic ratio in the range: $0.8 \leq (Pb+Rn)/Ti \leq 1.3$ and $0.5 \leq Pb/(Pb+Rn) \leq 0.99$, has a perovskite type crystal structure, and is of (001) unidirectional orientation or a mixture of (001) orientation and (100) orientation. The ferroelectric thin film can be formed on a silicon (100) substrate, typically by evaporating lead oxide and TiOx in a vacuum chamber while introducing an oxidizing gas therein.

10 Claims, 15 Drawing Sheets

FOREIGN PATENT DOCUMENTS

| | | |
|---|---|---|
| JP | 5-190798 Abst | 7/1993 |
| JP | 5-70242 Abst | 10/1993 |
| JP | 6-349811 Abst | 12/1994 |
| JP | 7-073732 Abs | 3/1995 |
| JP | 7-094608 Abs | 4/1995 |
| JP | 7-202039 Abs | 8/1995 |
| JP | 8-253323 Abst | 10/1996 |
| JP | 8-319158 Abst | 12/1996 |

OTHER PUBLICATIONS

Funakoshi et al., "Fabrication of Lead Titanate thin Film by Laser Ablation With Alternate Deposition of Lead Oxide and Titanium Oxide Precursors", Jap. J. Appl. Phys, Part 1, vol. 33, No. 9B, p. 5262–5264, 1994.*

Barnes et al., "Multiband Analysis of Photoluminescense Spectra from Electronically Excited Gas–Phase Species produced during laser Ablation of lead Oxide, Zirconium Oxide, Titanium oxide, and lead Zirconate Targets", Chem Ma(1995), vol.7(3), p. 477–485.*

Nakamura, T., et al., The Institute of Electronics, Information and Communication Engineers, pp. 53–59, Nov. 1993, "Study of Ferroelectric Thin Films for Application to NDRO Nonvolatile Memories".

Maiwa, H., et al., Japan J. Phys., vol. 31, No. 9B, pp. 3029–3032, Sep. 1992, "Crystalline Structure of $PbTiO_3$ Thin Films by Multiple Cathode Sputtering".

Hase, T., et al., Japan J. Appl. Phys., vol. 33, No. 9B, pp. 5244–5248, Sep. 1994, "Preparation of $Pb(Zr, Ti)O_3$ Thin Films by Multitarget Sputtering".

Kim, J., et al., Mt. Res. Soc. Symp. Proc., vol. 310, pp. 473–478, 1993, "Ultra–Thin Sputtered Films for ULSI DRAMS".

The Japan Society of Applied Physics and Related Societies 30p–T–3 (1993), 30a–ME–6 (1994), pp. 443 & 454.

Gao, Y., et al., "Microstructure of $PbTiO_3$, Thin films deposited on (001)MgO by MOCVD," *J. Mater. Res.*, vol. 8, No. 1, pp. 145–153, Jan. 1993.

Bai, G.R., et al., "The relationship between the MOCVD parameters and the crystallinity, epitaxy, and domain stucture of $PbTiO_3$ Films," *J. Mater. Res.*, vol. 9, No. 1 pp. 156–163, Jan. 1994.

Iijima, K., et al., "Preparation of c–Axis Oriented $PbTiO_3$ Thin Films and Their Crystallogaphic, Dielectric, and Pyroelectric Properties," *J. Appl. Phys.*, vol. 60, No. 1, pp. 361–367, Jul. 1986.

Iijima, K., et al., "Epitaxial Growth and the Crystallographic, Dielectric, and Pyroelectric Properties of Lanthanium–modified Lead Titanate Thin Films," *J. Appl. Phys.*, vol. 60, No. 8, pp. 2914–2919, Oct. 15, 1986.

Sakashita, Y., et al., "Dependence of Electrical Properties on Film Thickness in $PB(ZR_xTI_{1-x})O_3$ Thin Films Produced by Metalorganic Chemical Vapor Deposition," *J. Appl. Phys.*, vol. 73, No. 11, pp. 7857–7863, Jun. 1, 1993.

Panda, B., et al., "Electron Beam Deposited Lead–Lanthanium–Zirconate–Titanate then Films for Silicon Based Device Applications," *J. Appl. Phys.*, vol. 79, No. 2, pp. 1008–1012, Jan. 15, 1996.

Yamauchi, S., et al., "Growth of [111]–oriented Lead Zirconate Titanate Thin Films with Smooth Surface to Improve Electrical Properties," *J. Appl Phys.*, vol. 35, pp. 1553–1556, 1996.

* cited by examiner

PROCESS FOR PREPARING FERROELECTRIC THIN FILMS

This application is a Division of application Ser. No. 08/883,456 filed Jun. 26, 1997.

This invention relates to a film structure having a ferroelectric thin film, an electronic device comprising the film structure, and a recording medium utilizing the film structure. It also relates to a process for preparing a ferroelectric thin film.

The film structure finds use as electronic devices having a ferroelectric film incorporated in a semiconductor device including non-volatile memories, infrared sensors, optical modulators, optical switches, and opto-electronic integrated circuits (OEIC) as well as recording media of the type wherein information is recorded by inducing polarization reversal in ferroelectric material by means of an atomic force microscope (AFM) probe etc.

BACKGROUND OF THE INVENTION

Electronic devices have been elaborated which are fabricated by forming dielectric films on silicon substrates or semiconductor crystal substrates, followed by integration. Studies have been made to fabricate LSIs having a higher degree of integration and dielectric isolated LSIs relying on SOI technology, by combining semi-conductors with dielectrics. Ferroelectrics which are one class of dielectrics can be applied to non-volatile memories by utilizing their polarization reversal phenomenon. Also, infrared sensors, optical modulators, optical switches, OEIC (opto-electronic integrated circuits) or the like can be fabricated using ferroelectrics. Active research works have been made on the ferroelectric thin film material. It has also been investigated to apply the ferroelectric thin film to recording media of the type wherein polarization reversal by an AFM probe etc. is utilized to record information. In order to establish the non-volatile memories and recording media utilizing the polarization reversal of ferroelectrics, ferroelectric thin film materials having a sufficient residual polarization value to withstand repetitive record and retrieval cycles are necessary.

One of non-volatile memories devised heretofore is a memory of the structure using ferroelectric material in the gate of FET. As described in a technical report issued by the Japanese Electronic Information Communication Society, SDM 93-136, ICD 93-130, (1993-11), page 53, the memory using ferroelectric material in the gate has not reached the practically acceptable level because there remain many outstanding problems associated with their manufacture and the physical properties of ferroelectric thin films. For this type of memory, it is ideal, but difficult to implement a metal-ferroelectric-semiconductor (MFS) structure in the memory cell and therefore, a metal-ferroelectric-insulator-semiconductor (MFIS) structure or metal-ferroelectric-metal-insulator-semiconductor (MFMIS) structure must be fabricated. In order that the ferroelectric material undergo polarization reversal to ensure storage operation for this structure, an electric field of sufficient strength must be applied across the ferroelectric material. Since the ferroelectric material and insulator in the MFIS and MFMIS structures become equivalent to a serial connection of capacitors, it is necessary to take appropriate measures for lowering the dielectric constant of ferroelectric material and raising the dielectric constant of insulator in order that a sufficient electric field be applied across the ferroelectric material.

Among ferroelectric thin film materials, investigations have heretofore been made on lead family oxides such as $PbTiO_3$, PZT ($PbZrO_3$-$PbTiO_3$ system), and PLZT ($PbZrO_3$-$PbTiO_3$ system having $La_2O_3$ added thereto) and bismuth family oxides such as $Bi_2Ti_2NbO_9$ for the reason that they exhibit good polarization characteristics.

The PZT and PLZT, however, exhibit a dielectric constant as high as about 1,000 when they are formed into thin film. If they are used as a ferroelectric thin film in the above-mentioned MFIS and MFMIS structures, it is difficult to apply sufficient voltage.

On the other hand, $PbTiO_3$ has a dielectric constant of lower than about 100 at room temperature in bulk form, a spontaneous polarization value of $80\,\mu C/cm^2$ as theoretically calculated in bulk crystal form which is outstandingly greater than materials of other compositions, and a Curie temperature as high as 500° C. Namely, the physical data of $PbTiO_3$ found in the literature are most ideal when considered as the ferroelectric material for memories. Even in thin film form, $PbTiO_3$ has a dielectric constant as low as about 500. Nevertheless, the recent research and development works to form $PbTiO_3$ as a thin film to construct electronic devices revealed many problems. First, the voltage Ec at which polarization reversal occurs is as high as 85 kV/cm. Secondly, crystal defects and semiconductor areas can cause leakage in the thin film. Thirdly, fatigue or repetition properties of polarization reversal are poor. Specifically, the material deteriorates after about 1,000 cycles of polarization reversal.

The aforementioned lead and bismuth family oxides must be crystallized for their thin films to exhibit ferroelectric characteristics. The material can be crystallized by heating at a temperature of higher than 600° C. during thin film formation or by annealing a thin film at a temperature of higher than 600° C. as disclosed in Jpn. J. Appl. Phys., 31, 3029 (1992), Jpn. J. Appl. Phys., 33, 5244 (1994), and Mat. Res. Soc. Sympo. Proc., 243, 473 (1993). Since lead and bismuth, however, have a high vapor pressure in both elemental and oxide forms, they evaporate during heat treatment at elevated temperatures, incurring a compositional deviation. Composition control is thus difficult.

It is generally desired to use a single crystal form of ferroelectric material in order to ensure optimum device characteristics and reproducibility thereof. Polycrystal-line material is difficult to provide satisfactory device characteristics due to the disturbance of physical quantities by grain boundaries. This is also true for thin film materials, and a ferroelectric epitaxial film which is as close to a complete single crystal as possible is desired. The same applies to ferroelectric thin films for use in non-volatile memories of the above-mentioned MFIS or MFMIS structure, and a dielectric epitaxial film which is as close to a complete single crystal as possible is desired. Also for media (usually of the MFIS or MFMIS structure) wherein information is recorded using an AFM or STM probe, there is a demand for a ferroelectric epitaxial film which is as close to a complete single-crystal as possible because such a film enables to write a high density of bits. In order to form a ferroelectric epitaxial film in the MFIS or MFMIS structure, a metal thin film and a ferroelectric thin film must be epitaxially grown on a silicon substrate which is a semiconductor substrate. No one has succeeded in this epitaxial growth.

Insofar as lead family ferroelectric materials are concerned, a thin film which is free of a compositional deviation and approximate to a single crystal has not been formed on a semiconductor substrate. The high reactivity of lead family ferroelectric materials with silicon serving as the substrate allows for diffusion of Pb into the silicon substrate, which has serious influence on the characteristics of integrated circuits built in the silicon substrate.

SUMMARY OF THE INVENTION

An object of the invention is to provide a film structure having a ferroelectric thin film featuring a relatively low dielectric constant, great residual polarization, a low polarization reversing voltage, and minimal deterioration upon repetitive polarization reversal.

Another object of the invention is to provide a process for preparing a lead family ferroelectric thin film of a consistent composition and high crystallinity which could not be formed by conventional processes.

The present invention is directed to a film structure comprising a substrate and a ferroelectric thin film formed on one surface of the substrate.

In a first aspect of the invention, the ferroelectric thin film contains a rare earth element $R_1$, lead, titanium, and oxygen in an atomic ratio in the range:

$0.8 \leq (Pb+R_1)/Ti \leq 1.3$ and $0.5 \leq Pb/(Pb+R_1) \leq 0.99$, has a perovskite type crystal structure, and is of (001) unidirectional orientation or a mixture of (001) orientation and (100) orientation. $R_1$ is at least one rare earth element selected from the group consisting of Pr, Nd, Eu, Tb, Dy, Ho, Yb, Y, Sm, Gd, and Er. Preferably the surface of the substrate on which the ferroelectric thin film is formed has a silicon (100) plane.

In a second aspect of the invention, the surface of the substrate on which the ferroelectric thin film is formed has a silicon (100) plane, and the ferroelectric thin film contains a rare earth element $R_2$, lead, titanium, and oxygen in an atomic ratio in the range:

$0.8 \leq (Pb+R_2)/Ti \leq 1.3$ and $0.5 \leq Pb/(Pb+R_2) \leq 0.99$, has a perovskite type crystal structure, and is of (001) unidirectional orientation or a mixture of (001) orientation and (100) orientation. $R_2$ is at least one rare earth element selected from the group consisting of Pr, Nd, Eu, Tb, Dy, Ho, Yb, Y, Sm, Gd, Er, and La.

In one preferred embodiment, the film structure further includes an insulative subbing thin film between the substrate and the ferroelectric thin film, the insulative subbing thin film having a perovskite type crystal structure and being of (001) unidirectional orientation when it is tetragonal and (100) unidirectional orientation when it is cubic.

In another preferred embodiment, the film structure further includes an intermediate thin film between the substrate and the ferroelectric thin film, the intermediate thin film including a zirconium oxide base thin film which contains as a major component zirconium oxide or zirconium oxide stabilized with a rare earth element inclusive of scandium and yttrium and is of (001) unidirectional orientation when it is tetragonal or monoclinic and (100) unidirectional orientation when it is cubic. The intermediate thin film may further include a rare earth oxide base thin film which is disposed between the zirconium oxide base thin film and the ferroelectric thin film, contains an oxide of a rare earth element inclusive of scandium and yttrium as a major component, and is of (001) unidirectional orientation when it is tetragonal or monoclinic and (100) unidirectional orientation when it is cubic. The film structure may further include an insulative subbing thin film between the intermediate thin film and the ferroelectric thin film, the insulative subbing thin film having a perovskite type crystal structure and being of (001) unidirectional orientation when it is tetragonal and (100) unidirectional orientation when it is cubic.

In a further preferred embodiment, the film structure further includes a conductive subbing thin film disposed close to the ferroelectric thin film, wherein the conductive subbing thin film is a conductive metal thin film constructed of at least one metal selected from the group consisting of Pt, Ir, Os, Re, Pd, Rh, and Ru and/or a conductive oxide thin film constructed of an indiumcontaining oxide or an oxide having a perovskite type crystal structure and is of (001) unidirectional orientation when it is tetragonal and (100) unidirectional orientation when it is cubic.

Preferably, the ferroelectric thin film has a ten point mean roughness Rz of less than 10 nm across a reference length of 500 nm over at least 80% of its surface.

In the ferroelectric thin film, less than 60 atom % of the titanium may be replaced by at least one element selected from the group consisting of Zr, Nb, Ta, Hf, and Ce.

Also contemplated herein are an electronic device comprising the film structure and a recording medium comprising the film structure.

In a further aspect of the invention, there is provided a process for preparing a ferroelectric thin film of oxides containing at least Pb and Ti on a substrate by a multi-source evaporation method, comprising the steps of placing at least lead oxide and TiOx wherein $1 \leq x \leq 1.9$ as sources in an evaporation chamber and evaporating the sources in the chamber while introducing an oxidizing gas therein.

Preferably the evaporating step is controlled such that the atomic ratio of Pb/Ti elements supplied from the sources represented by $E_{(Pb/Ti)}$ and the atomic ratio of Pb/Ti elements in the ferroelectric thin film represented by $F_{(Pb/Ti)}$ satisfy the relationship: $1.5 \leq E_{(Pb/Ti)}/F_{(Pb/Ti)} \leq 3.5$. In preferred embodiments, the oxidizing gas is a partially radical oxygen; the substrate is heated at a temperature of about 500 to 700° C. during the evaporating step; the ferroelectric thin film may further contain at least one element selected from the group consisting of Zr, Nb, Ta, Hf, and Ce.

The process is applicable to the manufacture of the film structures of the first and second aspects.

FUNCTION

The composition of the ferroelectric thin film used in the present invention is a $PbTiO_3$ base composition plus a specific rare earth element. As previously mentioned, $PbTiO_3$ has adequate memory properties including spontaneous polarization, dielectric constant, and Curie point, but suffers from the drawbacks of too high voltage Ec required for polarization reversal, leakage in thin film, and fatigue by polarization reversal. The present invention has solved these problems.

By adding a specific proportion of rare earth element to $PbTiO_3$, the invention is successful in lowering the voltage Ec required for polarization reversal and restraining a reduction of residual polarization PR associated therewith. As a result of our precise study on rare earth elements which are unlikely to form semiconductors, we have succeeded in forming a ferroelectric thin film with minimal leakage. Finding that the fatigue by polarization reversal is affected by the type and amount of the rare earth element added, we have succeeded in forming a ferroelectric thin film with improved repetition properties.

More particularly, the ferroelectric thin film according to the invention contains lead (Pb), titanium (Ti), and oxygen (O). It further contains the rare earth element $R_1$ in the first embodiment and the rare earth element $R_2$ in the second embodiment. The second embodiment adds lanthanum (La) as a selection member to the group of rare earth elements which is defined in the first embodiment.

The ferroelectric thin film in the first embodiment is of (001) unidirectional orientation or a mixture of (001) orientation and (100) orientation. Owing to such orientation, the ferroelectric thin film exhibits improved properties, especially minimized leakage.

Japanese Patent Application Kokai (JP-A) No. 94608/1995 discloses to add Sc, Y and lanthanoids to an oxide ferroelectric material containing Pb and Ti as in the first embodiment of the present invention. In Example of this patent publication, a ferroelectric thin film is formed on a silicon (110) substrate by sputtering. The sputtering target used is $PbTiO_3$ containing $Y_2O_3$. The ferroelectric thin film formed by such a method in JP-A 94608/1995 does not acquire the orientation defined in the first embodiment of the present invention, but is believed approximate to a polycrystalline film. Poor crystallinity leads to less residual polarization. Example of the patent publication reports the advantage of suppressing the fatigue by polarization reversal, that is, the reduction of residual polarization by repetitive polarization reversal. However, the fatigue by polarization reversal is suppressed in JP-A 94608/1995 for the reason that less stresses are induced by polarization reversal due to the less residual polarization. The suppression of the fatigue by polarization reversal is not regarded practical if the residual polarization is lacking.

JP-A 202039/1995 discloses a lead titanate base ferroelectric material having added thereto Sm and Gd, which are used in the first embodiment of the present invention. In this patent publication, a ferroelectric layer is formed on a stack of a titanium nitride layer and a platinum layer. Sputtering, CVD, sol-gel and laser abrasion methods are described as the candidate method of forming the ferroelectric layer and the sol-gel method is used in Example. Even when the multilayer structure and the formation method described therein are employed, a ferroelectric thin film of specific orientation as defined in the first embodiment of the present invention cannot be formed and, of course, the advantages of the first embodiment are not available.

JP-A 73732/1995 discloses a lead zirconate titanate base ferroelectric material having added thereto Er, which is used in the first embodiment of the present invention. A sol-gel method is described therein as the method of forming the ferroelectric layer. The sol-gel method, however, cannot form a ferroelectric thin film of specific orientation as defined in the first embodiment of the present invention or achieve the advantages of the first embodiment.

In the second embodiment, the substrate on which the ferroelectric thin film is formed is a substrate having a silicon (100) plane as the ferroelectric thin film-bearing surface. It was found in our experiment that a $(Pb,La)TiO_3$ thin film was free of leakage and required a low polarization reversal voltage Ec when it was formed on a silicon (100) substrate and that the leakage and voltage Ec increased when formed on a MgO (100) substrate, for example. For this reason, the second embodiment uses a silicon (100) substrate. The silicon substrate has additional advantages as will be described later.

Ferroelectric thin films of lead titanate and lead zirconate titanate materials having added thereto La, which is used in the second embodiment of the invention, are disclosed in JP-A 138004/1984, 127103/1985, 252005/1987, 252006/1987, and 199745/1992 and JP-B 35249/1991. Some of the ferroelectric thin films described in these patent publications have a mixture of (001) orientation and (100) orientation. All the patent publications use a MgO (100) substrate and none of them form an oriented film on a silicon (100) substrate as in the second embodiment of the present invention. The above-mentioned orientation can be relatively easily accomplished when the MgO (100) substrate is used. However, since MgO has a greater coefficient of thermal expansion than Si, greater stresses are introduced in the ferroelectric thin film when it is cooled to room temperature after deposition. This results in a substantial increase of leakage. The reason why the above-mentioned orientation can be relatively easily accomplished on the MgO (100) substrate is that since the substrate is considerably shrunk, the crystal lattice of the ferroelectric thin film is likely to extend in a direction perpendicular to the substrate surface. As a result, it is apparently observed that c-axis is oriented perpendicular to the substrate surface. In fact, when a ferroelectric thin film of about 300 nm thick was formed on a MgO substrate, this film was found to have substantially poor properties, especially increased leakage, as compared with the degree of orientation estimated from X-ray diffraction. This occurred probably because a great amount of residual stress accumulated in the ferroelectric thin film due to shrinkage of the MgO substrate.

Of the above-referred patent publications, JP-A 199745/1992 discloses that a thin film of La-added lead titanate is formed on a silicon (100) substrate as evidenced by the X-ray diffraction diaphragm of FIG. 2. As also seen from the diaphragm of FIG. 2, only peaks corresponding to (100), (110), and (111) planes are observed in this thin film, which is not of (001) orientation. It is also evident from this patent publication that no one has succeeded in forming a La-added lead titanate thin film of (001) orientation on a silicon (100) substrate.

When thin films are formed from lead family dielectric materials, control of a Pb content is difficult. A compositional deviation is likely to occur since Pb has a higher vapor pressure than the remaining elements. A thin film of lead family ferroelectric material which is free of a compositional deviation and close to a single crystal has never been formed on a semiconductor substrate. Utilizing this nature of Pb in a contrary manner, we have found optimum conditions for multi-source evaporation. Under the optimum conditions, desired ferroelectric crystals are obtained in which just enough Pb is incorporated in perovskite crystals in a self-registering manner. The method of the invention is thus successful in forming a highly crystalline lead family ferroelectric thin film, achieving improved ferroelectric characteristics. Additionally, epitaxial growth becomes possible even on silicon substrates, which is advantageous in applications to electronic devices. Since the composition is based on $PbTiO_3$, the composition has a relatively low dielectric constant so that it is suitable in applications to memories of the structure using ferroelectric as the gate of FET. There is obtained an optimum thin film for memories having the MFIS or MFMIS structure applied thereto.

DESCRIPTION OF THE PREFERRED EMBODIMENTS

Figure 1:
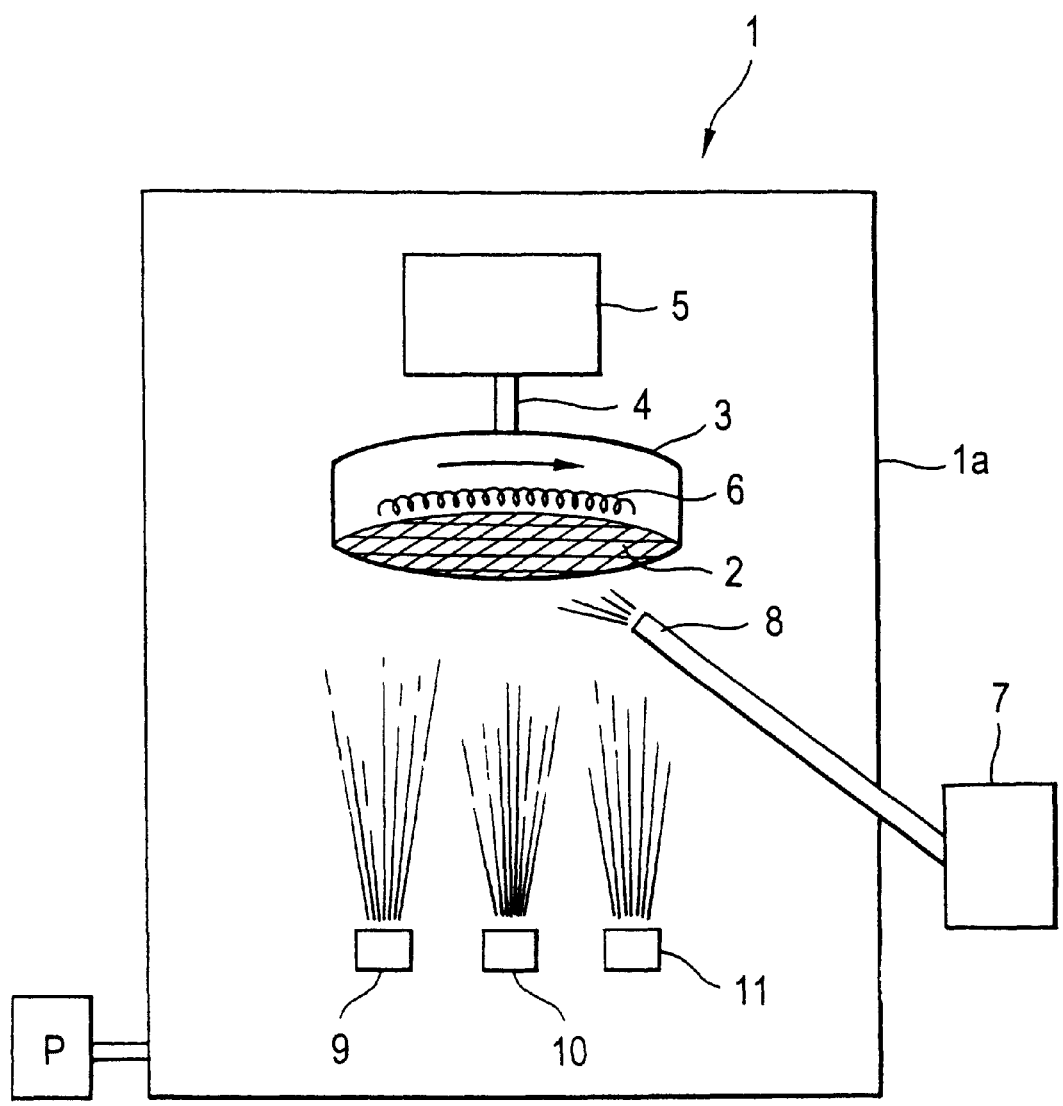
FIG. 1 is a schematic view illustrating one exemplary evaporation chamber for use in preparing a ferroelectric thin film according to the invention.

The film structure of the invention is defined as comprising a substrate and a ferroelectric thin film formed on one surface of the substrate. In one preferred embodiment, an intermediate thin film and/or an insulative subbing thin film is disposed between the substrate and the ferroelectric thin film. They are preferably stacked in the order of substrate, intermediate thin film, insulative subbing thin film, and ferroelectric thin film.

In another preferred embodiment, a conductive subbing thin film is disposed close to the ferroelectric thin film. In this embodiment, an intermediate thin film and/or an insulative subbing thin film is preferably disposed between the substrate and the conductive subbing thin film. They are preferably stacked in the order of substrate, intermediate thin film, insulative subbing thin film, conductive subbing thin film, and ferroelectric thin film. The thin films and the preparation thereof are described below as well as the substrate.

Ferroelectric Thin Film

The ferroelectric thin film that the film structure of the invention possesses has a composition containing a rare earth element, lead (Pb), titanium (Ti), and oxygen (O). That is, the composition is a PbTiO$_3$ base composition with a rare earth element $R_1$ or $R_2$ added thereto. In the following description, Rn is used as a representative of $R_1$ and $R_2$.

Rn substitutes for Pb at A site of the basic perovskite structure of PbTiO$_3$ material to deform the crystals. PbTiO$_3$ assumes a tetragonal system perovskite structure with a-axis: 3.904 Å and c-axis: 4.152 Å and having a polarization axis in c-axis direction. Since this crystal deformation occurs so as to reduce the ratio of a-axis to c-axis, the spontaneous polarization is slightly reduced and the voltage (Ec) required to reverse polarization, now in question, can be lowered. In contrast, the rare earth element other than Rn, for example, cerium (Ce) substitutes for Pb at B site of PbTiO$_3$ to achieve ineffective crystal deformation and significantly reduce the spontaneous polarization, which is undesirable for device applications.

In the ferroelectric thin film, the atomic ratio of elements falls in the range:

$$0.8 \leq (Pb+Rn)/T \leq 1.3 \text{ and}$$

$$0.5 \leq Pb/(Pb+Rn) \leq 0.99.$$

The preferred range is $0.9 \leq (Pb+Rn)/Ti \leq 1.2$ and $0.7 \leq Pb/(Pb+Rn) \leq 0.97$. If the ratio (Pb+Rn)/Ti is too low, little improvement in crystallinity is expectable. If the ratio (Pb+Rn)/Ti is too high, it would be difficult to form a homogeneous thin film. A ratio (Pb+Rn)/Ti within the above-defined range ensures satisfactory dielectric characteristics. If the ratio Pb/(Pb+Rn) is too low, the film would have reduced spontaneous polarization and a dielectric constant of more than 1,000. If the ratio Pb/(Pb+Rn) is too high, the additive effect of rare earth element for lowering Ec would become insufficient. A ratio Pb/(Pb+Rn) within the above-defined range is readily available by controlling the conditions under which the ferroelectric thin film is formed as will be described later. Note that the contents of Pb, Ti, and Rn are determined by X-ray fluorescence analysis.

In general, lead titanate contains Pb, Ti and O in an atomic ratio of Pb:Ti:O=1:1:3. In the film of the invention, the atomic ratio of oxygen can vary with the type and amount of Rn added and typically ranges from about 2.7 to about 3.3.

The ferroelectric thin film has a perovskite crystal structure and is preferably of (001) orientation. Since the (001) orientation means that <001> axis is perpendicular to an in-plane direction of the ferroelectric thin film and the PbTiO$_3$ materials having a perovskite type crystal structure exhibit ferroelectric characteristics in the direction of <001> axis, the ferroelectric thin film is more preferably a (001) unidirectionally oriented film having a (001) plane parallel to the film surface, most preferably an epitaxial film as will be defined later. The co-presence of (100) orientation having a (100) plane parallel to the film surface is acceptable in the practice of the invention. Although (100) oriented crystals sometimes form a 90° domain to slightly reduce spontaneous polarization, it gives rise to no substantial disturbance. Formation of a 90° domain is sometimes effective for improving ferroelectric characteristics because stresses within the thin film are reduced. On X-ray diffraction analysis of the thin film, the peak intensity ratio of (100)/(001) is preferably 3 or less. Even a thin film in which (100) orientation is co-present is preferably an epitaxial film as will be defined later.

Where a silicon (100) substrate is used, the preferred relationship of crystal axis orientation between the ferroelectric thin film and the silicon substrate is described below. It is understood that silicon has a cubic system. Where the ferroelectric thin film of perovskite structure is (001) unidirectionally oriented, the preferred crystal axis orientation relationship is perovskite [100]//Si [010]. Where the ferroelectric thin film is a mixture of (001) orientation and (100) orientation, the preferred crystal axis orientation relationship is perovskite [100]//Si [010] for the perovskite (001) oriented crystals and perovskite [001]//Si [010] for the perovskite (100) oriented crystals. That is, in-plane axes of the ferroelectric thin film are parallel to those of the silicon substrate.

It is noted that the term "unidirectionally oriented film" used herein designates a crystallized film in which the objective crystal faces are aligned parallel to the substrate surface. Illustratively stated, a (001) unidirectionally oriented or c plane unidirectionally oriented film, for example, is a film having an intensity of reflection other than on (00l) plane which is less than 10%, preferably less than 15% of the maximum peak intensity of reflection on (00l) plane as analyzed by 2θ-θ X-ray diffraction (XRD). It is noted that "c-plane" generally designates a plane having (001) axis as a normal and a plane having (0001) axis as a normal. It is also noted that the (00l) plane generally designates those equivalent planes such as (001) and (002) planes. The same applies to (l00) and (lll) planes.

It is further noted that the term "epitaxial film" used herein means that crystals are oriented in alignment in all the directions of X, Y, and Z axes, provided that the film surface is a X-Y plane and the film's thickness direction is Z axis. More particularly, in the first place, on measurement by X-ray diffraction, the peak intensity of reflection on planes other than the objective plane must be less than 10%, preferably less than 15% of the maximum peak intensity on the objective plane. For example, a (001) epitaxial film or c-plane epitaxial film, as analyzed by 2θ-θ X-ray diffraction, should have a peak intensity of reflection other than (00l) plane which is less than 10%, preferably less than 15% of the maximum peak intensity on (00l) plane. In the second place, a film as analyzed by RHEED should exhibit a spotty or streaky pattern. If these requirements are met, then this film is regarded to be an epitaxial film. It is understood that RHEED is an abbreviation of reflection high energy electron diffraction and the RHEED analysis is an index of the orientation of a crystal axis within a film plane.

In the ferroelectric thin film, part of Ti may be replaced by at least one of Zr, Nb, Ta, Hf and Ce. The percent replacement of Ti by these elements is preferably less than 60 at %. A too high percent replacement would cause a thin film to become anti-ferroelectric rather than ferroelectric. Where Ti is replaced by such elements, the aforementioned atomic ratio (Pb+Rn)/Ti is determined by converting the replacing elements into Ti for a calculation purpose.

Substrate

The substrate material used herein is not critical although a single crystal substrate is preferred. The single crystal substrate is preferably constructed of insulative materials such as magnesia, strontium titanate, sapphire, zirconia, stabilized zirconia, lithium niobate, and lithium tantalate, and semiconductors such as gallium arsenide and silicon. In particular, silicon single crystal substrates are preferred. Particularly when a silicon single crystal substrate is used such that (100) plane of silicon single crystal becomes the substrate surface, a ferroelectric thin film of improved characteristics can be formed thereon. Since silicon is commonly used in semiconductor devices, it is adequate when the film structure of the invention is incorporated with another device. Even when the film structure of the invention is used in combination with another device, they have a matching coefficient of thermal expansion. For example, MgO substrates are unsuitable for such combination since they have a coefficient of thermal expansion which is different by one order from that of Si. Additionally, silicon is relatively inexpensive.

Insulative Subbing Thin Film

In the preferred embodiment, the insulative subbing thin film is provided between the substrate and the ferroelectric thin film. The insulative subbing thin film is typically disposed close to the ferroelectric thin film where the conductive subbing thin film to be described later is not provided.

The insulative subbing thin film has a perovskite crystal structure. The perovskite structure is represented by the chemical formula: $ABO_3$ wherein A and B stand for cations. A is preferably at least one member selected from the group consisting of Ca, Ba, Sr, Pb, K, Na, Li, La, and Cd, especially Ba or Sr and B is preferably at least one member selected from the group consisting of Ti, Zr, Ta, and Nb, especially Ti. Namely, the insulative subbing thin film is most preferably formed of a composition based on barium titanate or strontium titanate.

In such perovskite type compounds, the atomic ratio A/B preferably ranges from 0.8/1 to 1.3/1, more preferably from 0.9/1 to 1.2/1. No crystallinity improvement is expected at an A/B ratio of less than 0.8 whereas an A/B ratio of more than 1.3 tends to make it difficult to form a homogeneous thin film. It is understood that the A/B ratio can be determined by X-ray fluorescence analysis. The stoichiometry of O in $ABO_3$ is not limited to 3. Some perovskite materials form a stable perovskite structure when they are in short or excess of oxygen. In $ABO_x$, x generally ranges from about 2.7 to about 3.3.

The insulative subbing thin film preferably has (001) unidirectional orientation, that is, c-planes unidirectionally oriented parallel to the substrate surface when the crystals are tetragonal, and (100) unidirectional orientation, that is, a-planes unidirectionally oriented parallel to the substrate surface when the crystals are cubic. In either case, the insulative subbing thin film is more preferably an epitaxial film. The preferred relationship of crystal orientation between the insulative subbing thin film and the silicon (100) substrate is tetragonal [100]//Si [010] or cubic [010]//Si [010]. This means that the thin film and the substrate are preferably such that their axes are parallel to each other within the film plane. Such a layer structure is effective for improving the crystallinity of a conductive subbing thin film and ferroelectric thin film to be formed thereon so that they may be formed as a unidirectionally oriented film and even an epitaxial film. Since the insulative subbing thin film has a good lattice matching with a ferroelectric thin film, a highly crystalline ferroelectric thin film is obtained thereon.

The insulative subbing thin film functions as an insulator in a MFIS or MFMIS structure.

Conductive Subbing Thin Film

The conductive subbing thin film is disposed between the substrate and the ferroelectric thin film in close contact with the ferroelectric thin film. The conductive subbing thin film functions as an electrode for the ferroelectric thin film and a lower electrode for constructing a MFMIS structure necessary for applying the ferroelectric thin film as a memory.

The conductive subbing thin film is preferably constructed of metals while indium-containing oxides and conductive perovskite oxides are also useful. A laminate of a metal film and an oxide film is also acceptable. The metal is at least one element selected from the group consisting of Pt, Ir, Os, Re, Pd, Rh, and Ru or an alloy containing at least one such element. Preferred examples of the indium-containing oxides and conductive perovskite oxides include $In_2O_3$, Sn-doped $In_2O_3$, $(R,Sr)CoO_3$, $(R,Sr,Ca)RuO_3$, $(R,Sr)RuO_3$, $SrRuO_3$, and $(R,Sr)MnO_3$ wherein R is a rare earth element inclusive of Sc and Y, and related compounds thereof.

Like the insulative subbing thin film, the conductive subbing thin film preferably has (001) unidirectional orientation when the crystals are tetragonal, and (100) unidirectional orientation when the crystals are cubic. In either case, it is most preferably an epitaxial film. The preferred relationship of crystal orientation between the conductive subbing thin film and the silicon (100) substrate is tetragonal [100]//Si [010] or cubic [0101]//Si [010]. This means that the thin film and the substrate are preferably such that their axes are parallel to each other within the film plane. Such a layer structure is effective for improving the crystallinity of a ferroelectric thin film to be formed thereon so that it may be formed as a unidirectionally oriented film and even an epitaxial film. Since the conductive subbing thin film has a good lattice matching with a ferroelectric thin film, a highly crystalline ferroelectric thin film is obtained thereon.

The conductive subbing thin film preferably has a resistivity of $10^{-5}$ to $10^{-2}$ $\Omega cm$ in bulk form and $10^{-5}$ to $10^{-2}$ $\Omega cm$ in thin film form. Also the conductive subbing thin film may be constructed of a superconductor material.

Intermediate Thin Film

Between the substrate and the ferroelectric thin film, an intermediate thin film is preferably provided. Where the insulative subbing thin film is provided, it is disposed between the intermediate thin film and the ferroelectric thin film. The intermediate thin film consists of a zirconium oxide base thin film or a zirconium oxide base thin film and a rare earth oxide base thin film. Note that the rare earth oxide base thin film is disposed between the zirconium oxide base thin film and the ferroelectric thin film. The intermediate thin film functions as an insulator in an MFMIS or MFIS structure.

Zirconium Oxide Base Thin Film

The zirconium oxide base thin film is composed mainly of zirconium oxide or zirconium oxide stabilized with a rare earth metal element (inclusive of scandium and yttrium), that is, stabilized zirconia. The provision of this thin film prevents the overlying subbing thin film or ferroelectric thin film from being stripped. This thin film also presents good lattice matching with a subbing thin film of barium titanate or the like, allowing a highly crystalline ferroelectric thin film to be formed thereon.

The zirconium oxide or stabilized zirconium oxide is preferably of the composition: $Zr_{1-x}R_xO_{2-\delta}$ wherein R is a rare earth metal element inclusive of scandium and yttrium, x is 0 to 0.75, and δ is 0 to 0.5. R is preferably at least one member selected from the group consisting of Pr, Ce, Nd, Gd, Tb, Dy, Ho and Er while x and δ will be described later.

Desirably, the zirconium oxide base thin film has unidirectional crystal orientation. The reason is that neither subbing thin film nor ferroelectric thin film can be epitaxially grown on a thin film having a plurality of crystal faces because grain boundaries are present in such a thin film.

More illustratively, the zirconium oxide base thin film is preferably of (001) unidirectional orientation when the crystals are tetragonal or monoclinic and of (100) unidirectional orientation when the crystals are cubic. In either case, the zirconium oxide base thin film should more preferably be an epitaxial film. If a zirconium oxide base thin film with such improved crystallinity can be formed, the disturbance of physical quantities by grain boundaries is eliminated and an insulative subbing thin film, conductive subbing thin film and ferroelectric thin film of quality are obtained on the zirconium oxide base thin film.

Where an intermediate thin film ($Zr_{1-x}R_xO_{2-\delta}$) and insulative subbing thin film are successively deposited on a silicon (100) substrate surface, the preferred crystal orientation relationship between them is $BaTiO_3$ (001)//$Zr_{1-x}R_xO_{2-\delta}$ (001)//Si (100) and $BaTiO_3$[100]//$Zr_{1-x}R_xO_{2-\delta}$ [100]//Si [010]. It is understood that this relationship stands when both the intermediate thin film and the insulative subbing thin film are tetragonal. Even when the respective thin films are cubic, the same applies in the sense that axes are preferably parallel to each other within the film plane.

It is estimated from prior art examples such as YBCO that an epitaxial $BaTiO_3$ film of (001) orientation is produced as follows. Since the crystal orientation relationship required is $BaTiO_3$ (001)//$Zr_{1-x}R_xO_{2-\delta}$ (001)//Si (001) and $BaTiO_3$ [110]//$Zr_{1-x}R_xO_{2-\delta}$ [100]//Si [010], epitaxial growth would take place if a lattice matching is achieved by rotating the unit lattice of $BaTiO_3$ within c plane 45° with respect to the lattice of $Zr_{1-x}R_xO_{2-\delta}$. However, our experiment revealed it difficult to establish such a crystal orientation relationship. We have found that the desired film can be constructed with the relationship: $BaTiO_3$ (001)//$Zr_{1-x}R_xO_{2-\delta}$ (001)//Si (100) and $BaTiO_3$ [100 //$Zr_{1-x}R_xO_{2-\delta}$ [100]//Si [010].

More specifically, the $Zr_{1-x}R_xO_{2-\delta}$ and $BaTiO_3$ films have a lattice constant of 0.52 and 0.40 for a-axis, respectively. With the relationship: $BaTiO_3$[110]//$Zr_{1-x}R_xO_{2-\delta}$ [100]//Si 010] which allows for a lattice matching by 45° in-plane rotation, the misfit amounts to 8.4%. In contrast, with the lattice matching relationship: $BaTiO_3$ [100]//$Zr_{1-x}R_xO_{2-\delta}$ [100]//Si [010] according to the invention, an a-plane of $BaTiO_3$ crystal and an a-plane of $Zr_{1-x}R_xO_{2-\delta}$ crystal match with each other without rotation whereupon four lattices of $BaTiO_3$ (0.4×4=1.60 nm) match with three lattices of $Zr_{1-x}R_xO_{2-\delta}$ (0.52×3=1.56 nm). At this time, the misfit is 2.6%, indicating good matching. Accordingly, the present invention has succeeded in obtaining an epitaxial $BaTiO_3$ film of (001) orientation by utilizing the relationship: $BaTiO_3$ [100]//$Zr_{1-x}R_xO_{2-\delta}$ [100]//Si [010].

$ZrO_2$ undergoes phase transition of cubic→tetragonal→monoclinic system as the temperature varies from high temperature to room temperature. Zirconium oxide having a rare earth element added thereto for stabilizing its cubic crystals is stabilized zirconia. The crystallinity of $Zr_{1-x}R_xO_{2-\delta}$ film depends on the range of x. As reported in Jpn. J. Appl. Phys., 27 (8), L1404–L1405 (1988), crystals are tetragonal or monoclinic in the compositional region where x is less than 0.2. Heretofore, epitaxial films of unidirectional orientation have been available in the cubic crystal region where x is 0.2 or more. It is noted that in the region where x is in excess of 0.75, crystals are cubic, but (100) unidirectional orientation is not available and crystals of (111) orientation are co-present. On the other hand, in the tetragonal or monoclinic region, no epitaxial films of unidirectional orientation have been available due to the introduction of undesirably oriented planes as described in J. Appl. Phys., 58 (6), 2407–2409 (1985).

Therefore, from the crystal orientation point of view, x in $Zr_{1-x}R_xO_{2-\delta}$ should preferably range from 0.2 to 0.75. The more preferred range of x is from 0.2 to 0.50. If the zirconium oxide base thin film is an epitaxial film, then it is easy for an insulative subbing thin film or ferroelectric thin film to epitaxially grow thereon.

The type and amount of the rare earth metal element contained in the stabilized zirconia are selected such that the zirconium oxide base thin film may have a lattice constant which well matches with the lattice constants of the silicon substrate and a thin film to be deposited on the zirconium oxide base thin film. For example, the above-mentioned $Zr_{1-x}R_xO_{2-\delta}$ having a lattice constant of 0.52 nm is obtained when R is yttrium (Y) and x=0.3. Although the lattice constant can be changed by changing parameter x for the fixed type of rare earth element, changing parameter x only affords a narrow adjustable range for lattice constant matching. In this regard, if praseodymium (Pr) is used instead of yttrium (Y), for example, a greater lattice constant is obtainable, providing for optimum matching with $BaTiO_3$ crystals of the insulative subbing thin film.

It is understood that zirconium oxide free of oxygen defects is represented by the chemical formula: $ZrO_2$ while the amount of oxygen in the zirconium oxide having a rare earth element added thereto varies with the type, amount and valence of the rare earth element added, so that δ in $Zr_{1-x}R_xO_{2-\delta}$ generally ranges from 0 to 0.5.

In the region of $Zr_{1-x}R_xO_{2-\delta}$ wherein x is less than 0.2, especially the high purity region of the composition wherein the proportion of zirconium in the constituent elements other than oxygen is in excess of 93 mol %, neither crystallinity nor surface flatness has been obtained as previously mentioned. As a result of our successive study, we have found that the above-mentioned unidirectional orientation and even epitaxial growth becomes possible and surface flatness is improved to a satisfactory value when the preparation method to be described later is employed. A $ZrO_2$ film of high purity has the following advantages.

As the proportion of Zr in the constituent elements excluding oxygen becomes higher, that is, as the purity of $ZrO_2$ becomes higher, the insulation resistance becomes higher and the leak current is reduced. Then a higher proportion of Zr is favorable where insulative properties are necessary. Also where $ZrO_2$ is used as an insulator in a metal-insulator-semiconductor (MIS) structure, the hysteresis of the C-V characteristic as found when yttrium-stabilized zirconia (YSZ) is used as an insulator is eliminated, offering improved interfacial properties for MIS devices. This is probably because stresses generated between the silicon substrate and the zirconium oxide base thin film due to the difference in coefficient of thermal expansion therebetween are mitigated by a phase transition of $ZrO_2$ and because $ZrO_2$ has less oxygen defects. YSZ does not act to release stresses because of the lack of phase transition and has much oxygen defects because of the rare earth element added. Also in the MFMIS and MFIS structures, the use of $ZrO_2$ as an insulator is preferred in that the C-V hysteresis by polarization reversal of ferroelectric material is effectively achieved since the C-V hysteresis associated with the IS moiety is eliminated.

Accordingly, where satisfactory crystallinity and surface flatness are obtained, the proportion of zirconium in the constituent elements excluding oxygen is preferably in excess of 93 mol %, more preferably at least 95 mol %, further preferably at least 98 mol %, most preferably at least 99.5 mol %. The constituent elements excluding oxygen and zirconium are generally rare earth elements and phosphorus. The upper limit of the proportion of zirconium is about 99.99 mol % at the present. Since separation of $ZrO_2$ from $HfO_2$ is difficult with the currently available ultra-purifying technique, the purity of $ZrO_2$ generally indicates the purity of Zr+Hf. Therefore, the purity of $ZrO_2$ in the specification is a value calculated on the assumption that Hf and Zr are identical. However, this gives rise to no problem because $HfO_2$ serves exactly the same function as $ZrO_2$ in the zirconium oxide base thin film according to the invention.

It is noted that when an intermediate thin film is formed, oxygen in the intermediate thin film can diffuse in proximity to the surface of the silicon single crystal substrate to oxidize the substrate surface to a slight depth (for example, less than about 5 nm) to form an oxide layer of $SiO_2$ etc. Some film formation methods allow a silicon oxide layer to be left on the surface of the substrate of silicon or the like during formation of the intermediate thin film.

Rare Earth Oxide Base Thin Film

When the stabilized zirconia is used as the intermediate thin film, its C-V characteristic exhibits hysteresis and in this regard, it is inferior to the high purity $ZrO_2$ film. In this case, it is possible to deprive the C-V characteristic of hysteresis by depositing a rare earth oxide base thin film on the zirconium oxide base thin film. Also depositing a rare earth oxide base thin film thereon further improves the lattice matching with the ferroelectric thin film.

The rare earth oxide base thin film is formed on the zirconium oxide base thin film because the rare earth oxide base material alone cannot form a film of (001) or (100) unidirectional orientation, but a film of cubic (111) orientation.

The rare earth oxide base thin film is preferably constructed essentially of a rare earth oxide containing at least one member selected from the group consisting of Y, La, Ce, Pr, Nd, Sm, Eu, Gd, Tb, Dy, Ho, Er, Tm, Yb, and Lu, especially the group consisting of Ce, Pr, Nd, Gd, Tb, Dy, Ho, and Er. Where two or more rare earth elements are used, their ratio is arbitrary.

Where the rare earth oxide base thin film is stacked, the zirconium oxide base thin film may be either a film having a uniform distribution of elements or a film of the graded structure that the composition varies in a film thickness direction. In the case of the graded film, the content of rare earth element in the zirconium oxide base thin film increases gradually or stepwise and the content of zirconium decreases gradually or stepwise from the substrate side to the rare earth oxide base thin film side. Such a graded film minimizes or eliminates the misfit of lattice between the zirconium oxide base thin film and the rare earth oxide base thin film, allowing the rare earth oxide base thin film to be formed as a high crystallinity epitaxial film. In the case of such a merging laminate, the rare earth element of the rare earth oxide base thin film is preferably the same as the rare earth element added to the zirconium oxide base thin film.

Additives may be admixed in the zirconium oxide base thin film and rare earth oxide base thin film for the purpose of improving their characteristics. For example, if these thin films are doped with an alkaline earth element such as Ca and Mg, then the number of pinholes in the film can be reduced to restrain leakage. Also, aluminum and silicon are effective for lowering the resistivity of the film. Further, transition metal elements such as Mn, Fe, Co, and Ni allow the film to form therein an energy level (or trap level) due to the impurity, which can be utilized to control conductivity.

Crystallinity Surface Flatness and Thickness of Thin Films

The subbing thin films and intermediate thin film should preferably have good crystallinity and a flat surface for the purpose of improving the crystallinity of a thin film to be formed thereon.

The respective layers can be evaluated for crystallinity in terms of the half-value width of a rocking curve of reflection peak in X-ray diffractometry (XRD) and the pattern of a RHEED image. The surface flatness can be evaluated in terms of streakiness of a RHEED image and. surface roughness (ten point mean roughness) as measured by AFM.

Preferably, the insulative subbing thin film, conductive subbing thin film and intermediate thin film have such crystallinity that a rocking curve of reflection on a (002) plane upon X-ray diffraction has a half-value width of less than 1.50°. Also preferably, the surface roughness (ten point mean roughness) Rz as measured by AFM across a reference length of 500 nm is less than 2 nm, especially less than 0.60 nm for the insulative subbing thin film and intermediate thin film, and less than 10 nm for the conductive subbing thin film. It is desired that such a surface roughness be available over a region of more than 80%, more preferably more than 90%, especially more than 95% of the surface of each thin film. The above-described surface roughness is a value obtained by carrying out measurement at arbitrary 10 or more points evenly distributed over an area of at least 10 $cm^2$ of a thin film formed over the entire surface of a substrate.

With respect to the half-value width of a rocking curve and Rz, no particular lower limit values need be determined while smaller values are preferred. At the present, the lower limit of the half-value width of a rocking curve is about 0.4° and the lower limit of ten point mean roughness Rz across a reference length of 500 nm is about 0.10 nm.

Also, a RHEED image which is streaky and sharp indicates that the relevant thin film has improved crystallinity and surface flatness.

The thickness of the insulative subbing thin film varies with a particular application although it is preferably 5 to 500 nm, more preferably 50 to 150 nm. The insulative subbing thin film should preferably be thin to such an extent that its crystallinity and surface flatness are not impaired. Where the insulative subbing thin film is used as an insulative layer, its thickness is preferably about 50 to about 500 nm.

Also the thickness of the conductive subbing thin film varies with a particular application although it is preferably 5 to 500 nm, more preferably 50 to 150 nm. The conductive subbing thin film should preferably be thin to such an extent that its crystallinity and surface flatness are not impaired. Where the conductive subbing thin film is used as an electrode layer, its thickness is preferably about 50 to about 500 nm. with a particular application although it is preferably 5 to 500 nm, more preferably 10 to 50 nm. The intermediate thin film should preferably be thin to such an extent that its crystallinity and surface flatness are not impaired. Where the intermediate thin film is used as an insulative layer, its thickness is preferably about 50 to about 500 nm. It is noted that where the intermediate thin film is of multilayer structure, the respective sub-layers should preferably have a thickness of more than 0.5 nm and the total thickness of the sub-layers should preferably fall in the above-mentioned range.

When the surface of the ferroelectric thin film is similarly measured by AFM, the ten point mean roughness Rz across a reference length of 500 nm should preferably be less than 10 nm, especially less than 5 nm. There is no particular lower limit for Rz. A lower value of Rz is preferable. When the ferroelectric thin film is used to construct a memory whose capacity is in proportion to the number of bits, the number of bits per unit area must be increased in order to provide a high capacity memory. If the ferroelectric thin film has good surface flatness, recording becomes possible with smaller bit areas. Then the improved surface flatness is effective in increasing the number of bits per unit area. At the present, the lower limit of Rz is about 1 nm.

Electronic Device

The film structure of the invention can be worked by a semiconductor process and formed as capacitors and FET gates, constructing electronic devices such as non-volatile memories and IR sensors. It is also applicable to optical modulators, optical switches, and opto-electronic integrated circuits (OEIC).

Recording Medium

The film structure of the invention can also be applied to a recording medium of the type wherein information is recorded using a probe in the form of an atomic force microscope (AFM) or scanning tunneling microscope (STM).

A method of recording information in a ferroelectric material using an AFM probe is disclosed in JP-A 193349/1988, for example. Information is written by applying a pulse voltage across the ferroelectric material by means of an AFM probe or the like to thereby reverse the polarization only in the probed region. The region where polarization reversal has occurred becomes a recorded bit, bearing the information. For information reading, the piezoelectric effect, pyroelectric effect, electro-optical effect and detection of current flow upon polarization reversal may be utilized. More illustratively, while an appropriate high-frequency bias voltage is applied between the recording medium and the probe, the medium is scanned with the probe. At this point, the surface of the recording medium is deformed by the piezoelectric effect of the ferroelectric thin film. Between the recorded bit region and the unrecorded region, the direction of polarization is opposite and hence, the piezoelectric effect is different. Then, a deformation corresponding to the presence of the recorded bit appears on the surface of the recording medium. This deformation is detected by the probe, thereby discriminating the recorded bit. The recorded bit may be erased as by applying a pulse voltage of opposite polarity to that used upon recording for thereby reversing the polarization.

The film structure of the invention to which such a recording and retrieving method is applied should have a FMIS or FIS construction. In order that an electric field be applied to the ferroelectric thin film upon recording and retrieving operation, in the case of the FIS construction, a substrate having a high conductivity is used and functions as a lower electrode.

Further, where the ferroelectric thin film is formed on the silicon substrate, information is recorded utilizing the electric charge capture and release phenomenon by polarization reversal. A depletion layer is formed by the charge captured in the silicon semiconductor substrate. The depletion layer thus formed changes the capacitance of the probed region, thereby forming a recorded bit. The recorded bit is read by scanning the recording medium with the probe while applying an appropriate high-frequency bias voltage between the medium and the probe. Since the capacitance between the probe and the medium is different between the charge-captured region and the charge-uncaptured region, the recorded bit can be discriminated by detecting a capacitance change associated with probe scanning. The recorded bit may be similarly erased.

In this recording/retrieving method, a film structure of FIS construction is used as a recording medium and an electric field is applied by way of a semiconductor portion.

The AFM or STM has a resolving power of the atomic level. Also, the ferroelectric material has a rate of polarization reversal as high as 100 ns or less and record bits can be formed to a size of less than 10 nm in diameter. The development of a memory with a high density of more than about 100 megabits/cm² is thus expected. Such a high density memory will be reasonably manufactured since a ferroelectric thin film having satisfactory surface flatness is obtained according to the invention.

Preparation of Ferroelectric Thin Film

Now it is described how to prepare the ferroelectric thin film according to the invention.

In the practice of the method of the invention, an evaporation apparatus as described in FIG. 1 is preferably used. Although the following description refers to a PGT thin film having a composition of $PbTiO_3$ plus Gd as a lead family ferroelectric thin film, thin films of other lead family ferroelectric materials can be similarly formed.

The evaporation apparatus 1 includes a vacuum chamber 1a connected to a vacuum pump P. A holder 3 is disposed in the vacuum chamber 1a for holding a substrate 2 so that the substrate 2 may face downward. The holder 3 is connected to a motor 5 through a driving shaft 4. The motor 5 drives the holder 3 to rotate the substrate 2 within its surface. A heater 6 is built in the holder for heating the substrate 2.

The evaporation apparatus 1 further includes an oxidizing gas supply 7 with a nozzle 8 opening just below the holder 3. Then an oxidizing gas is fed such that the partial pressure of oxidizing gas is higher in proximity to the substrate 2. Disposed below the holder 3 are a PbO source 9, a TiOx source 10, and a rare earth element source 11. Each of these sources includes a source material container and means for feeding energy for evaporating the source material, e.g., an electron beam generator and resistive heater.

Lead oxide (PbO) is used as the lead source because Pb has a higher vapor pressure on a hot substrate. If elemental lead is used as a source material, Pb is evaporated again near the substrate, little depositing on the substrate. The use of PbO increases a rate of deposition. Similarly, titanium oxide (TiOx) is used as the titanium source because of an increased rate of deposition. Ti is more susceptible to oxidation than PbO. If elemental titanium is used instead of TiOx, Ti deprives the PbO of oxygen to convert the PbO into Pb, which is undesirably evaporated again near the substrate.

It is noted that in TiOx, x is preferably in the range: $1 \leq x < 1.9$, more preferably $1 \leq x < 1.8$, further preferably $1.5 \leq x \leq 1.75$, most preferably $1.65 \leq x \leq 1.75$. Upon receipt of heat energy, TiOx within this range melts and evaporates to provide a stable rate of evaporation in the vacuum chamber. In contrast, $TiO_2$ changes into TiOx upon receipt of heat energy while releasing oxygen in the vacuum chamber. This results in a significant variation of pressure in the vacuum chamber and an unstable rate of evaporation. Composition control is then difficult.

First of all, the substrate is set on the holder. The substrate may be any of the aforementioned materials although a silicon single crystal substrate is preferred. A silicon single crystal substrate cut so as to make (100) plane a surface is most preferred. A single crystal substrate having the aforementioned intermediate thin film, insulative subbing thin film, and conductive subbing thin film previously formed thereon is also preferably used as the substrate.

With the method of the invention used, a homogeneous ferroelectric thin film can be formed on a substrate with a large surface area, for example, of more than 10 cm². As a result, electronic devices and recording media having ferroelectric thin films can be manufactured at a considerably lower cost than in the prior art. The upper limit of the surface area of substrates is not critical although it is about 400 cm² at the present. Then the present invention can accommodate for the current semiconductor process which commonly uses silicon wafers with a diameter of 2 to 8 inches, especially 6 inches. Also a ferroelectric thin film an be formed on a selected portion of the wafer surface through a mask rather than the entire wafer surface.

Next, while the substrate is heated in vacuum, PbO, TiOx and Gd are supplied to the substrate surface along with the oxidizing gas, thereby depositing a ferroelectric thin film. The heating temperature is preferably about 500 to 700° C., especially about 550 to 650° C. At temperatures of lower than 500° C., few highly crystalline ferroelectric thin films would be deposited. Temperatures of higher than 700° C. would promote reaction of lead vapor with silicon of the substrate and prevent deposition of a crystalline lead family ferroelectric thin film. Reaction of lead vapor with platinum would also occur at such higher temperatures when a ferroelectric thin film is deposited on a conductive subbing thin film of Pt or the like.

The oxidizing gas used herein may be oxygen, ozone, atomic oxygen, $NO_2$, free radical oxygen or the like although it is preferred to use radical oxygen as a major or minor portion of the oxidizing gas. The following description refers to a typical example wherein radical oxygen is produced using an electron cyclotron resonance (ECR) oxygen source.

While the vacuum chamber is continuously evacuated by means of the vacuum pump, predominantly free radical oxygen gas is continuously supplied from the ECR oxygen source 7 into the vacuum chamber 1a. The partial pressure of oxygen in proximity to the substrate is preferably about $10^{-3}$ to $10^{-1}$ Torr. The upper limit of oxygen partial pressure is determined to be $10^{-1}$ Torr for preventing the metals in the sources in the vacuum chamber from being degraded and for maintaining the rate of evaporation of the metals constant. The preferred mode of supplying oxygen gas into the vacuum chamber is by injecting the oxygen gas toward the substrate surface from nearby so as to establish an atmosphere having a high oxygen partial pressure only in proximity to the substrate. Then reaction on the substrate can be more effectively promoted with a less feed of oxygen gas. Since the vacuum chamber is continuously evacuated, the majority of the vacuum chamber is under a low pressure of about $10^{-4}$ to $10^{-6}$ Torr. The feed rate of oxygen gas is preferably about 2 to 50 cc/min., more preferably about 5 to 25 cc/min. An appropriate feed rate of oxygen gas can be previously determined since the optimum feed rate of oxygen gas depends on the volume of the vacuum chamber, the evacuation rate of the vacuum pump, and other factors.

The source materials are heated and evaporated by electron beams or other suitable means whereby the source material vapors are supplied to the substrate. The rate of deposition is preferably about 0.05 to 1.00 nm/s, more preferably about 0.100 to 0.500 nm/s. A too low deposition rate would be difficult to maintain constant and thus result in a heterogeneous film. A too high deposition rate would result in a less crystalline thin film with surface irregularities.

TiOx and Gd may be supplied to the substrate at evaporation rates corresponding to the desired compositional ratio since substantially the entire feed amounts of them are taken in the PGT crystal growing on the substrate. In contrast, PbO is difficult to control since it has a high vapor pressure and tends to induce a compositional deviation. As long as lead family ferroelectrics are concerned, prior art techniques have never succeeded in forming a nearly single crystal thin film free of a compositional deviation. The present invention utilizes such characteristics of PbO in an opposite sense and controls such that the amount of PbO vapor fed from its source to the substrate is in excess of the desired ratio of PbO in the PGT film crystal being formed. PbO is fed in excess such that the atomic ratio of Pb to Ti fed from their sources, $Pb/Ti=E_{(Pb/Ti)}$ and the atomic ratio of Pb to Ti in the ferroelectric thin film formed, $Pb/Ti=F_{(Pb/Ti)}$ may satisfy the relationship: $1.5 \leq E_{(Pb/Ti)}/F_{(Pb/Ti)} \leq 3.5$, preferably $1.7 \leq E_{(Pb/Ti)}/F_{(Pb/Ti)} \leq 2.5$, more preferably $1.9 \leq E_{(Pb/Ti)}/F_{(Pb/Ti)} \leq 2.3$. The excess of PbO, that is, the PbO which has not been incorporated in the perovskite structure is evaporated again on the substrate surface whereby only a PGT film of perovskite structure grows on the substrate. If $E_{(Pb/Ti)}/F_{(Pb/Ti)}$ is too low, an insufficient amount of Pb would be fed into the depositing film to lower the ratio of (Pb+Rn)/Ti in the film, failing to produce a highly crystalline perovskite structure. Inversely, if $E_{(Pb/Ti)}/F_{(Pb/Ti)}$ is too high, there would result a film having a too high ratio of (Pb+Rn)/Ti allowing another Pb-rich phase to develop along with the perovskite phase, failing to produce a perovskite single phase structure.

As mentioned above, the method of the invention uses PbO and TiOx as evaporation sources to increase a percent deposition, uses radical oxygen for enhancing oxidation, and heats the substrate at a temperature in the specific range, thereby allowing PGT crystals of a substantially stoichiometric composition having just enough Pb incorporated therein to grow on the substrate in a self-registering manner. The method is outstandingly prominent in that a lead family perovskite crystal thin film of stoichiometric composition, that is, a fully high crystallinity ferroelectric thin film is produced.

When the depositing surface area is more than about 10 cm$^2$, for example, when a film is deposited on a substrate with a diameter of 2 inches, the substrate is rotated as shown in FIG. 1 whereby the oxidizing gas is uniformly distributed throughout the substrate surface to promote oxidation reaction over the entire depositing surface area. This enables formation of a large surface area homogeneous film. Desirably, the substrate is rotated at about 10 rpm or higher. A lower rotational speed can provide a distribution of film thickness in the substrate plane. The upper limit of the rotational speed is not critical although it is usually about 120 rpm due to mechanical restrictions of the vacuum apparatus.

After the ferroelectric thin film is formed, it is desirably annealed if necessary. The film is preferably annealed at a temperature of about 500 to 850° C., more preferably about 650 to 800° C. for about 1 second to 30 minutes, more preferably about 5 to 15 minutes. The annealing of the ferroelectric thin film generally improves the ferroelectric characteristics despite a possibility that (100) orientation appear or the proportion of (100) orientation increase. When a MFMIS or MFIS structure is produced by forming an electrode layer on the ferroelectric thin film, the film may be annealed either prior to or subsequent to the formation of the electrode layer. Since annealing is effected after crystallization, no compositional deviation can be induced by annealing.

As is apparent from a comparison with conventional methods such as vacuum evaporation, sputtering, and laser ablation methods, the method of preparing a ferroelectric thin film according to the invention can be carried out under easily controllable conditions leaving no room of impurity inclusion. Accordingly the inventive method is suited in producing a desired ferroelectric thin film of completeness and a large area in a reproducible manner.

According to the inventive method, a desired thin film can be similarly produced using a molecular beam epitaxy (MBE) apparatus.

There has been described a method for preparing a thin film of a rare earth element-containing lead titanate composition which is a ferroelectric thin film included in the film structure of the invention. The inventive method is also applicable to PT and PZT compositions free of a rare earth element, with equivalent results. The inventive method is further applicable to bismuth family oxide thin films. Although in the prior art, bismuth family oxide thin films are also difficult to control their composition because of the high vapor pressure of bismuth in vacuum, the inventive method is successful in producing bismuth family oxide thin films of quality by substituting a Bi$_2$O$_3$ source for the PbO source. Also in the case of the bismuth family, there is obtained ferroelectric thin film crystals of a substantially stoichiometric composition having just enough Bi incorporated therein in a self-registering manner.

Fabrication of Film Structure

It is now described how to fabricate the film structure of the invention.

Surface Treatment of Substrate

Where a silicon single crystal substrate is used, the substrate is preferably surface treated prior to the formation of an intermediate thin film. The necessity of surface treatment is described below.

The surface configuration of several atom layers at the crystal surface is generally different from the atom configuration of an imaginary surface obtained when a bulk crystal (three-dimensional large crystal) structure is sectioned. Since the surrounding situation of atoms exposed at the surface is changed by the removal of crystals on one side, the exposed atoms accordingly tend to assume a stable state of lower energy. As a general rule, this structural change results in a mere relaxation of atom positions in some cases and induces atom recombination to form a rearrangement structure in other cases. The former occurs on most crystal surfaces. The latter generally forms a superlattice structure at the surface. Provided that a and b are the magnitudes of unit vectors of a bulk surface structure, if a superlattice structure having magnitudes ma and nb is created, it is referred to as a m×n structure.

In order that an oxide thin film epitaxially grow on a silicon substrate, the configuration of the silicon substrate surface must be stable and play the role of transmitting the crystal structure information to an oxide film to be grown thereon. Since the atom configuration which seems to appear when a bulk crystal structure is sectioned is a 1×1 structure, the surface configuration of a substrate on which an oxide thin film is to be epitaxially grown must be a stable 1×1 structure.

The cleaned silicon (100) surface becomes a 1×2 or 2×1 structure, and the cleaned silicon (111) surface becomes a complex superstructure having a large unit mesh of a 7×7 or 2×8 structure as will be described later. These cleaned silicon surfaces are undesirable.

Also the cleaned silicon surfaces are highly reactive and especially at the temperature at which an oxide thin film is epitaxially formed (at least 700° C.), and tend to react with the residual gases in vacuum, typically hydrocarbons to form SiC at the surface to contaminate the substrate surface and disorder the surface crystals. In forming an oxide thin film, such a reactive silicon surface must be protected.

For this reason, the silicon single crystal substrate is preferably subject to surface treatment by the following procedure.

First, the silicon single crystal substrate with its surface cleaned is secured to the holder as shown in FIG. 1 and placed in the vacuum chamber. By heating the substrate while supplying oxidizing gas into the chamber, a silicon oxide layer is formed on the substrate surface. The oxidizing gas used herein may be selected from the same group as mentioned for the deposition of the ferroelectric thin film although air can also be used. The silicon oxide layer is to protect the substrate surface from rearrangement and contamination. The thickness of the silicon oxide layer is preferably about 0.2 to 10 nm. A silicon oxide layer of less than 0.2 nm thick provides insufficient protection. The reason why the upper limit is 10 nm will be described later.

The heating step is to heat the substrate to a temperature of about 300 to 700° C. at a rate of about 30 to 70° C./min. and hold it at the temperature for 0 to about 10 minutes. Too high temperatures and heating rates would lead to insufficient formation of silicon oxide layers whereas too low temperatures or too long holding time would result in too thick silicon oxide layers.

Introduction of an oxidizing gas is preferably carried out, where oxygen is used as the oxidizing gas, for example, by first evacuating the vacuum chamber to a vacuum of about $1\times10^{-7}$ to $1\times10^{-4}$ Torr and introducing the oxidizing gas to establish an atmosphere having an oxygen partial pressure of $1\times10^{-4}$ to $1\times10^{-1}$ Torr at least in the proximity of the substrate.

After the above-mentioned step, the substrate is heated in vacuum. Since the silicon crystals at the substrate surface are protected by the silicon oxide layer, any contamination, for example, formation of SiC by reaction with the residual gas, hydrocarbon is avoided. Preferably the heating temperature is about 600 to 1,200° C., especially about 700 to 1,100° C. At temperatures below 600° C., a 1×1 structure is not available on the surface of the single crystal silicon substrate. At temperatures above 1,200° C., the silicon oxide film provides insufficient protection to the silicon crystals, allowing the single crystal silicon substrate to be disordered in crystallinity.

Next, zirconium and an oxidizing gas or zirconium, a rare earth element (inclusive of Sc and Y), and an oxidizing gas are supplied to the substrate surface. In this step, the metals including zirconium function to reduce the silicon oxide layer formed in the preceding step and extinguish it. At the same time, zirconium and oxygen or zirconium, rare earth element and oxygen form a 1×1 surface structure on the thus exposed silicon crystal surface.

Figure 17:
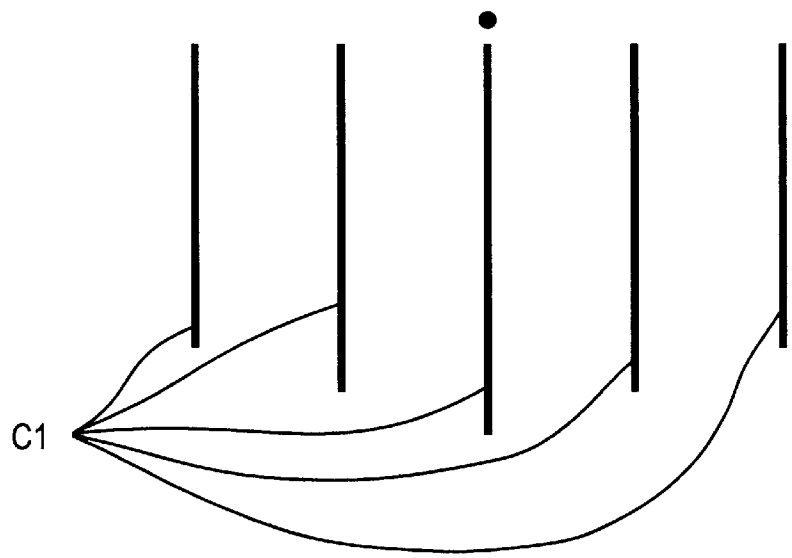
FIG. 17(a) is a schematic view showing a RHEED pattern of a 1×1 surface structure.
FIG. 17(b) is a schematic view showing a RHEED pattern of a 2×1 and/or 1×2 surface structure.
Figure 17:
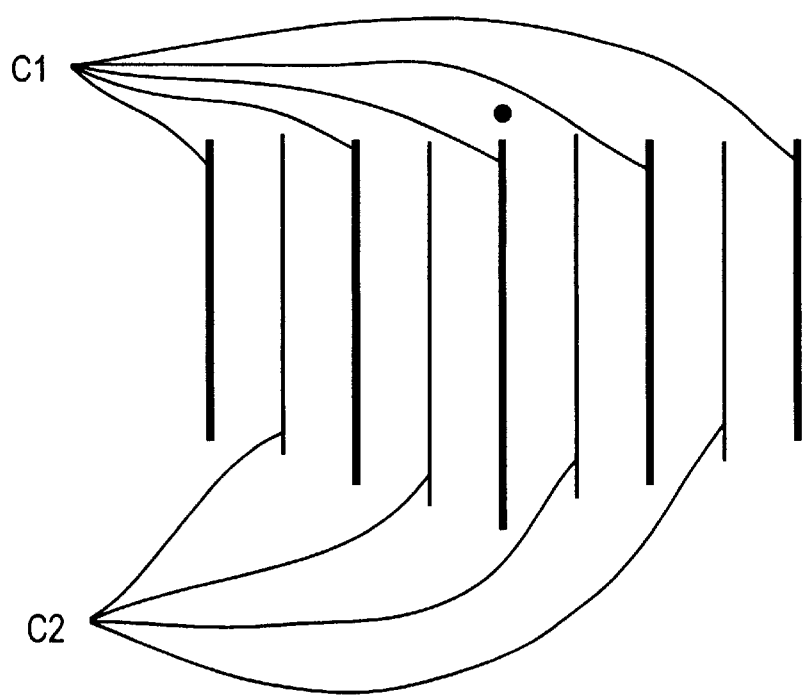

The surface structure can be examined by observing an image pattern by reflection high energy electron diffraction (RHEED). In the case of the 1×1 surface structure which is desirable in the present invention, for example, a pattern of complete streaks of an even-order C1 as shown in FIG. 17(*a*) is obtained for electron beam incident direction [110]. The same pattern is obtained for incident direction [1-10]. On the other hand, the cleaned surface of silicon single crystal has a surface structure of 1×2, 2×1 or a mixture of 1×2 and 2×1 in the case of (100) plane, for example. In such a case, the pattern of a RHEED image is a pattern consisting of streaks of an even-order C1 and streaks of a half-order C1 and a half-order C2 as shown in FIG. 17(*b*) for either one or both of electron beam incident directions [110] and [1-10]. In the RHEED pattern of the 1×1 surface structure, the streaks of a half-order C2 as shown in FIG. 17(*b*) is not observed in both electron beam incident directions [110] and [1-10 ].

The cleaned silicon (100) surface sometimes shows a 1×1 structure. It was observed several times in our experiments. However, the conditions under which a 1×1 structure is available are indefinite, and it is impossible under the current circumstances to produce a 1×1 structure on the cleaned silicon surface in a consistent reproducible manner. A cleaned silicon surface whether it is of a 1×2, 2×1 or 1×1 structure is susceptible to contamination in vacuum at high temperature and especially reacts with hydrocarbons in the residual gas to form SiC on the surface, whereby the crystals on the substrate surface are disordered.

The amount of zirconium or zirconium and rare earth element fed is preferably about 0.3 to 10 nm, especially about 3 to 7 nm calculated as the thickness of an oxide film deposited when they are evaporated in an oxidizing atmosphere. Such a feed amount is expressed as nanometers calculated as oxide, hereinafter. Less than 0.3 nm calculated as oxide would not fully exert the effect of reducing silicon oxide. With amounts of more than 10 nm calculated as oxide, asperities as observed at the atomic level tend to develop at the surface and such asperities deprive the surface crystal arrangement of the 1×1 structure. The upper limit of the thickness of the silicon oxide layer is 10 nm because there is a possibility that the metal do not fully reduce a silicon oxide layer of thicker than 10 nm even when the metal is fed as above.

Where oxygen is used as the oxidizing gas, it is preferably fed at a rate of about 2 to 50 cc/min. The optimum amount of oxidizing gas fed is determined by the volume of the vacuum chamber, evacuation rate of the vacuum pump and other factors and it is recommended to previously determine an appropriate flow rate.

Formation of Intermediate Thin Film

Of the intermediate thin films, the zirconium oxide base thin film is preferably formed by the method of our U.S. Ser. No. 08/516,356 which is incorporated herein by reference.

In forming a thin film composed mainly of $ZrO_2$, a silicon substrate which has been surface treated is first heated. The heating temperature for film formation is desirably higher than about 400° C. for crystallization of zirconium oxide, more desirably higher than about 750° C. for improved crystallinity, most desirably higher than about 850° C. for achieving film crystal surface flatness on the molecular level. The upper limit of the heating temperature of the single crystal substrate is about 1,300° C.

Thereafter, zirconium is heated and evaporated by electron beams or the like whereby it is supplied to the substrate surface. At the same time, an oxidizing gas and optionally, a rare earth element are supplied to the substrate surface, forming a zirconium oxide base thin film. The film deposition rate is desirably about 0.05 to 1.00 nm/s, especially about 0.100 to 0.500 nm/s for the reason that a slower rate of deposition is difficult to maintain constant whereas a faster rate results in a thin film having poor crystallinity and an irregular surface.

Various deposition conditions including the type and feed amount of oxidizing gas, oxygen partial pressure in proximity to the substrate, and revolution of the substrate are the same as mentioned for the deposition of the ferroelectric thin film.

Where a rare earth oxide base thin film is deposited on the zirconium oxide base thin film, only a rare earth element is used as the evaporation source. Conditions including the feed of oxidizing gas and substrate temperature may be the same as mentioned for the deposition of the zirconium oxide base thin film. Where the same rare earth element is used in both the thin films, the supply of zirconium is interrupted when the zirconium oxide base thin film is formed to the predetermined thickness and only the supply of rare earth metal is continued to thereby continuously form the rare earth oxide base thin film. Also when it is desired to form a zirconium oxide base thin film of a graded structure, the supply of zirconium is gradually reduced and eventually to zero before transition to the formation of the rare earth oxide base thin film.

Insulative Subbing Thin Film

An embodiment of forming a $BaTiO_3$ film as an insulative subbing thin film on the intermediate thin film is described.

Subsequent to the formation of the intermediate thin film, metallic Ba and Ti are supplied to the substrate surface while heating and the supply of oxidizing gas are continued. Ba and Ti are fed in such amounts to achieve Ba:Ti=1:1. The orientation of a $BaTiO_3$ film is largely affected by the temperature of the substrate during deposition and the feed ratio of Ba/Ti at the initial of deposition. In order that the relationship of crystal orientation among the $BaTiO_3$ film, intermediate thin film $(Zr_{1-x}R_xO_{2-\delta})$, and silicon (100) substrate be $BaTiO_3$ (001)//$Zr_{1-x}R_xO_{2-\delta}$ (001)//Si (100) and $BaTiO_3$[100]//$Zr_{1-x}R_xO_{2-\delta}$ [1001]// Si [010] as previously mentioned, the heating temperature during $BaTiO_3$ film formation is desirably about 800 to 1,300° C., more desirably about 900 to 1,200° C. It is desired that the Ba/Ti feed ratio at the initial growth period be from 1 to 0, preferably from 1 to 0.8 in molar ratio. This suggests that titanium is preferably fed in excess at the initial growth period. Herein, a Ba/Ti ratio of 0 indicates that only titanium may be fed during the initial growth period. If the heating temperature is too high, the film laminate would become less crystalline due to inter-diffusion. If the heating temperature is too low or if the Ba/Ti feed ratio at the initial growth period is inadequate, there would result $BaTiO_3$ having (110) orientation rather than the desired (001) orientation or a (001) oriented $BaTiO_3$ thin film having (110) orientation mixed therein. In the initial growth period, the barium supplied tends to react with the underlying zirconium oxide base thin film, retarding formation of $BaTiO_3$ of the desired orientation. Titanium is fed in excess during the initial growth period because it is desired to avoid reaction between Ba and zirconium oxide. The initial growth period is a duration passed until a film thickness of about 1 nm is reached.

Various deposition conditions associated with the deposition of the insulative subbing thin film including the deposition rate, type and feed amount of oxidizing gas, oxygen partial pressure in proximity to the substrate, and revolution of the substrate are the same as mentioned for the deposition of the zirconium oxide base thin film.

As is apparent from a comparison with conventional methods such as vacuum evaporation, sputtering, and laser ablation methods, the methods of preparing the intermediate thin film and insulative subbing thin film can be carried out under easily controllable conditions leaving no room for impurity inclusion. Accordingly the inventive methods are suited in producing a desired thin film of completeness and a large area in a reproducible manner. A desired thin film can be similarly produced using a MBE apparatus.

Conductive Subbing Thin Film

Evaporation is preferred when a conductive subbing thin film is formed of a metal. The substrate is preferably at a temperature of about 500 to 750° C. during evaporation. Lower substrate temperatures would result in less crystalline films whereas higher substrate temperatures would result in films with surface asperities. Crystallinity can be further improved by introducing a RF plasma into the vacuum chamber during evaporation while supplying a minor amount of oxygen. In the case of a Pt thin film, for example, such measures are effective for preventing (111) orientation from being admixed in (001) orientation.

When the conductive subbing thin film is formed of indium-containing oxides or conductive perovskite oxides, the above-mentioned method for forming the ferroelectric thin film or insulative subbing thin film is advantageously used. Alternatively, reactive multi-source evaporation and sputtering methods are used.

Ferroelectric Thin Film

The ferroelectric thin film included in the film structure of the invention is preferably formed by the above-mentioned method for forming the ferroelectric thin film.

EXAMPLE

Examples of the invention are given below by way of illustration.

Example 1

A MgO single crystal disc having a diameter of 2 inches was cut so as to make (100) plane a surface and mirror polished. A (001) oriented film of platinum was deposited on one surface of the substrate by evaporation. A ferroelectric thin film was formed on the substrate by the following procedure.

The substrate was secured to a substrate holder equipped with rotating and heating mechanisms in a vacuum chamber. The sources placed in the chamber were PbO, TiOx wherein x=1.67, and Gd. The vacuum chamber was then evacuated to a vacuum of $10^{-6}$ Torr by means of an oil diffusion pump. The substrate was rotated at 20 rpm and heated at 600° C. While radical oxygen gas was fed from an ECR oxygen source toward the substrate at a rate of 10 cc/min., the PbO, TiOx, and Gd were evaporated from their sources, depositing a Pb—Gd—Ti composite oxide film (referred to as PGT thin film, hereinafter) to a thickness of 300 nm. The feed rates from the evaporation sources were controlled so as to give a molar ratio PbO:Gd:TiOx of 2:0.1:1, that is, $E_{(Pb/Ti)}$=2.0.

The composition of the thus formed PGT thin film was examined by X-ray fluorescence analysis, finding (Pb+Gd)/Ti=1.02 and Pb/(Pb+Gd)=0.90. This composition corresponds to $F_{(Pb/Ti)}$=0.92, which gives $E_{(Pb/Ti)}/F_{(Pb/Ti)}$2.2.

Figure 2:
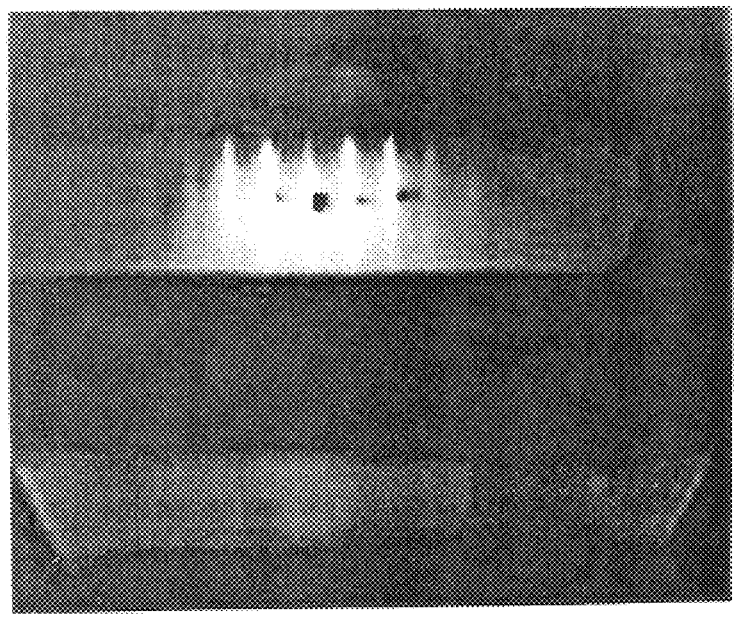
FIG. 2 is a photograph of crystalline structure illustrating a RHEED pattern of a PGT thin film formed on a Pt (001) thin film on a MgO (100) substrate, as observed when an electron beam is incident from MgO [100] direction.

The PGT thin film was also examined by RHEED. FIG. 2 shows a RHEED pattern of the PGT thin film. The electron beam was incident in [110] direction of the MgO substrate. As seen from FIG. 2, the diffraction pattern of the surface of this PGT thin film was a fully streaky pattern. It was thus confirmed from the RHEED pattern and X-ray diffraction that the PGT thin film was a c-plane oriented epitaxial film of the perovskite structure. The film was further measured at ten points over its entire surface for ten point mean roughness Rz across a reference length L of 500 nm according to JIS B0610. The ten point mean roughness Rz was 6.3 nm on the average, 9.0 nm at the maximum, and 1.3 nm at the minimum, indicating a flat surface.

Example 2

The substrate used herein was a disc of p-type silicon single crystal having a resistivity of 5 Ωcm and a diameter of 2 inches which was cut so as to make (100) plane a surface and mirror polished. The mirror polished surface was cleaned by etching with a 40% ammonium fluoride aqueous solution. On the surface of the substrate, a $ZrO_2$ thin film (intermediate thin film), a $BaTiO_3$ thin film (insulative subbing thin film), and a ferroelectric thin film were formed in the described order by the following procedure. The respective thin films were examined by X-ray diffractometry and RHEED by taking out corresponding samples from the vacuum chamber midway the series of thin film forming steps. Note that the same sampling procedure was used in the following examples.

The substrate was secured to a substrate holder equipped with rotating and heating mechanisms in a vacuum chamber.

The vacuum chamber was then evacuated to a vacuum of $10^{-6}$ Torr by means of an oil diffusion pump. The substrate was rotated at 20 rpm and heated at 600° C. while oxygen gas was fed through a nozzle toward the substrate at a rate of 25 cc/min. A silicon oxide layer of about 1 nm thick was thus formed.

Next, the substrate was rotated at 20 rpm and heated at 900° C. While oxygen gas was fed through the nozzle toward the substrate at a rate of 25 cc/min., zirconium was evaporated from its source in an amount of 5 nm calculated as the thickness of zirconium oxide, yielding a surface treated silicon substrate having a 1×1 surface structure.

Next, the substrate was rotated at 20 rpm and heated at 900° C. While oxygen gas was fed at a rate of 25 cc/min., zirconium was evaporated from its source to form a zirconium oxide ($ZrO_2$) thin film of 10 nm thick on the surface treated silicon substrate as an intermediate thin film.

On analysis, only the peak of (00l) reflection was observed in X-ray diffractometry and the half-value width of a rocking curve of (002) reflection was 0.7°, indicating that the $ZrO_2$ thin film was a unidirectionally oriented, highly crystalline film which had not been formed in the prior art. It is noted that since the (002) peak overlapped the Si (200) peak attributable to the silicon substrate, the above-mentioned half-value width is inclusive of the Si (200) peak.

The thin film was also examined by RHEED. The diffraction pattern of the surface of this thin film was a fully streaky pattern, which indicated that the thin film was an epitaxial film. The film was similarly measured for ten point mean roughness Rz, finding a Rz of 0.80 nm on the average, 1.00 nm at the maximum, and 0.08 nm at the minimum, indicating a flat surface on the molecular level.

Instead of the $ZrO_2$ thin film, a yttrium-stabilized zirconia (YSZ) thin film was formed. It showed crystallinity and surface flatness equivalent to the $ZrO_2$ thin film. The $ZrO_2$ thin film and YSZ thin film were measured for resistivity. The resistivity of the $ZrO_2$ thin film was 5 times the resistivity of the YSZ thin film, indicating that the $ZrO_2$ thin film was fully insulative.

Next, the substrate was rotated at 20 rpm and heated at 900° C. While oxygen gas was fed through the nozzle at a rate of 25 cc/min., zirconium and titanium were evaporated from their sources in an atomic ratio of 1:1 to form a $BaTiO_3$ thin film of 50 nm thick on the $ZrO_2$ thin film as an insulative subbing thin film.

On analysis of the $BaTiO_3$ thin film, only the peak of (00l) reflection was observed in X-ray diffractometry and the half-value width of a rocking curve of (002) reflection was 1.4°, indicating that the $BaTiO_3$ thin film was a (001) unidirectionally oriented, highly crystalline film. The $BaTiO_3$ thin film was also examined by RHEED. The diffraction pattern of the surface of this thin film was a fully streaky pattern, which indicated that the thin film was an epitaxial film.

It is evident from the results of X-ray diffractometry of the respective thin films that the relationship of crystal orientation among the silicon substrate, $ZrO_2$ thin film, and $BaTiO_3$ film was $BaTiO_3$ (001)//$ZrO_2$ (001)// Si (100). The respective thin films were examined by RHEED with the incident direction of electron beam fixed, finding $BaTiO_3$[100]//$ZrO_2$ [100]//Si [010].

Next, a PGT thin film of 300 nm thick was formed as in Example 1. The composition of the thus formed PGT thin film was examined by X-ray fluorescence analysis, finding (Pb+Gd)/Ti=1.01 and Pb/(Pb+Gd)=0.89. This composition corresponds to $F_{(Pb/Ti)}$=0.90, which gives $E_{(Pb/Ti)}/F_{(Pb/Ti)}$2.2.

Figure 3:
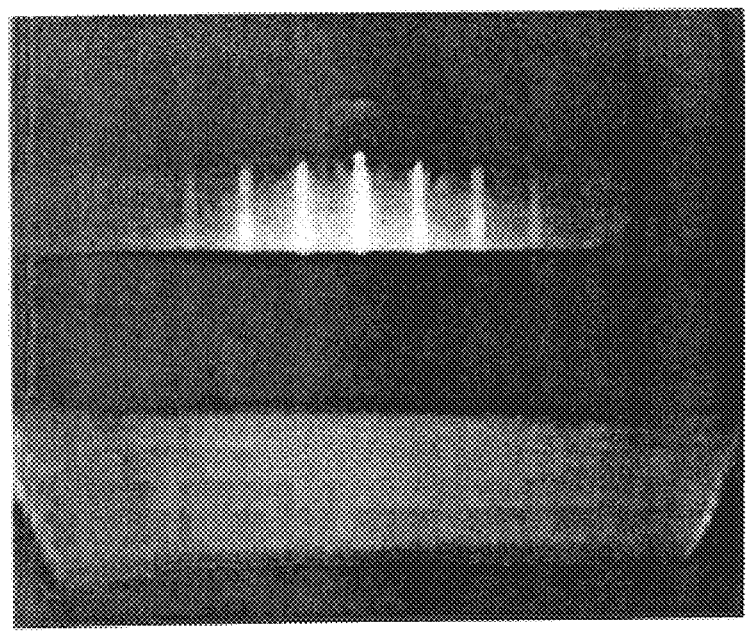
FIG. 3 is a photograph of crystalline structure illustrating a RHEED pattern of a PGT thin film formed on a BaTiO$_3$ (001)/ZrO$_2$(001)/Si(100) structure, as observed when an electron beam is incident from Si [110] direction.

The PGT thin film was also examined by RHEED. FIG. 3 shows a RHEED pattern of the PGT thin film. The electron beam was incident in [110] direction of the silicon substrate. As seen from FIG. 3, the diffraction pattern of the surface of this PGT thin film was a fully streaky pattern. It was thus confirmed from the RHEED pattern and X-ray diffraction that the PGT thin film was a c-plane oriented epitaxial film of the perovskite structure. The film was further measured for ten point mean roughness Rz as in Example 1. The ten point mean roughness Rz was 3.0 nm on the average, 7.5 nm at the maximum, and 0.9 nm at the minimum, indicating a flat surface.

Figure 4:
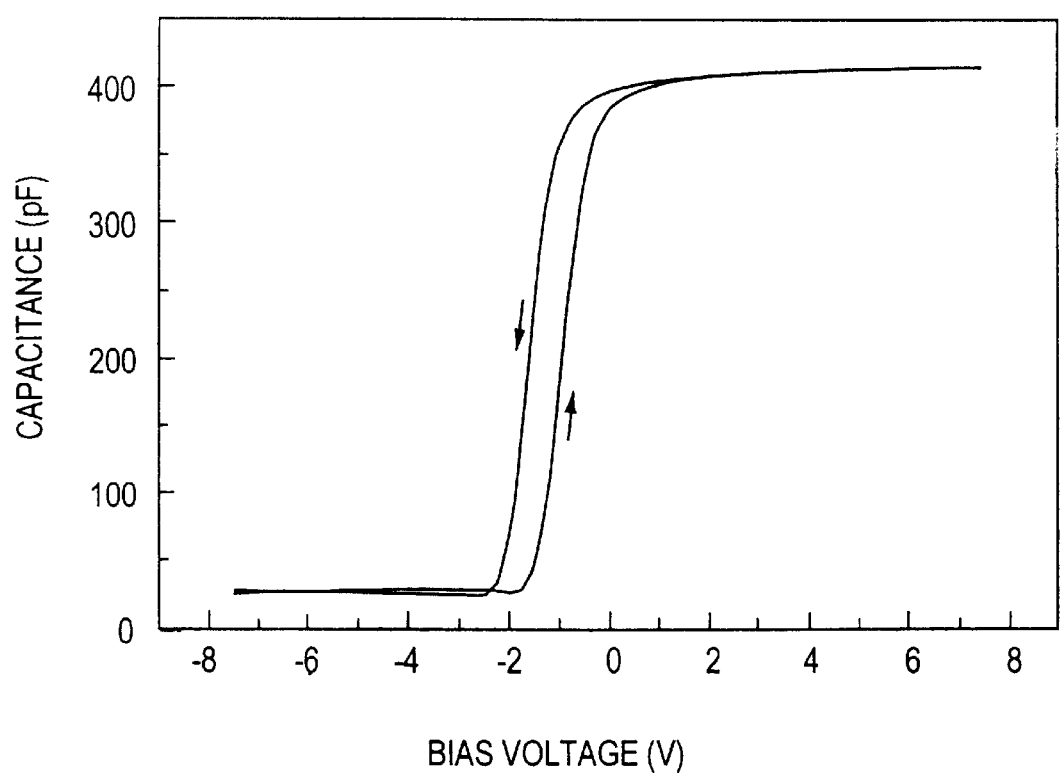
FIG. 4 is a diagram showing the C-V characteristic of a MFIS structure using a PGT ferroelectric thin film.

A platinum electrode was formed on the surface of the PGT thin film, constructing a MFIS structure. It was annealed in air at 750° C. for 10 minutes. An ohmic electrode of aluminum was formed on the back surface of the substrate. The assembly was examined for the C-V characteristic, with the results plotted in FIG. 4. A hysteresis loop is found in the diagram of FIG. 4. The loop had a hysteresis width of about 0.8 volts. Using the ferroelectric thin film as the gate oxide film of FET, a device which could utilize this characteristic was fabricated. While varying the gate voltage of FET, the source-drain current was measured. A memory window of 0.7 volts was obtained, and non-volatile memory operation was confirmed. As opposed to conventional ferroelectrics such as PZT having a dielectric constant of abut 1,000, the PGT thin film had a low dielectric constant of about 200. This feature is best suited for gate type non-volatile memory devices having the MFIS structure.

Example 3

On the same single crystal silicon substrate as in Example 2, a $ZrO_2$ thin film (intermediate thin film), a $BaTiO_3$ thin film (insulative subbing thin film), a Pt film (conductive subbing thin film), and a ferroelectric thin film were formed in the described order. The $ZrO_2$ and $BaTiO_3$ thin films were formed as in Example 2.

Next, the substrate having the $BaTiO_3$ thin film on the surface was heated at 700° C. and a Pt thin film of 100 nm thick was formed thereon by vacuum evaporation. In forming the Pt thin film, oxygen gas was introduced at a rate of 3 cc/min. and a RF plasma of 100 W was applied so as to avoid mixing of Pt (111). On analysis by X-ray diffractometry and RHEED, the Pt thin film was found to be a (001) unidirectionally oriented epitaxial film.

Next, a PGT thin film of 300 nm thick was formed as in Example 1. The composition of the thus formed PGT thin film was examined by X-ray fluorescence analysis, finding (Pb+Gd)/Ti=1.07 and Pb/(Pb+Gd)=0.90. This composition corresponds to $F_{(Pb/Ti)}$=0.96, which gives $E_{(Pb/Ti)}/F_{(Pb/Ti)}$=2.1.

Figure 5:
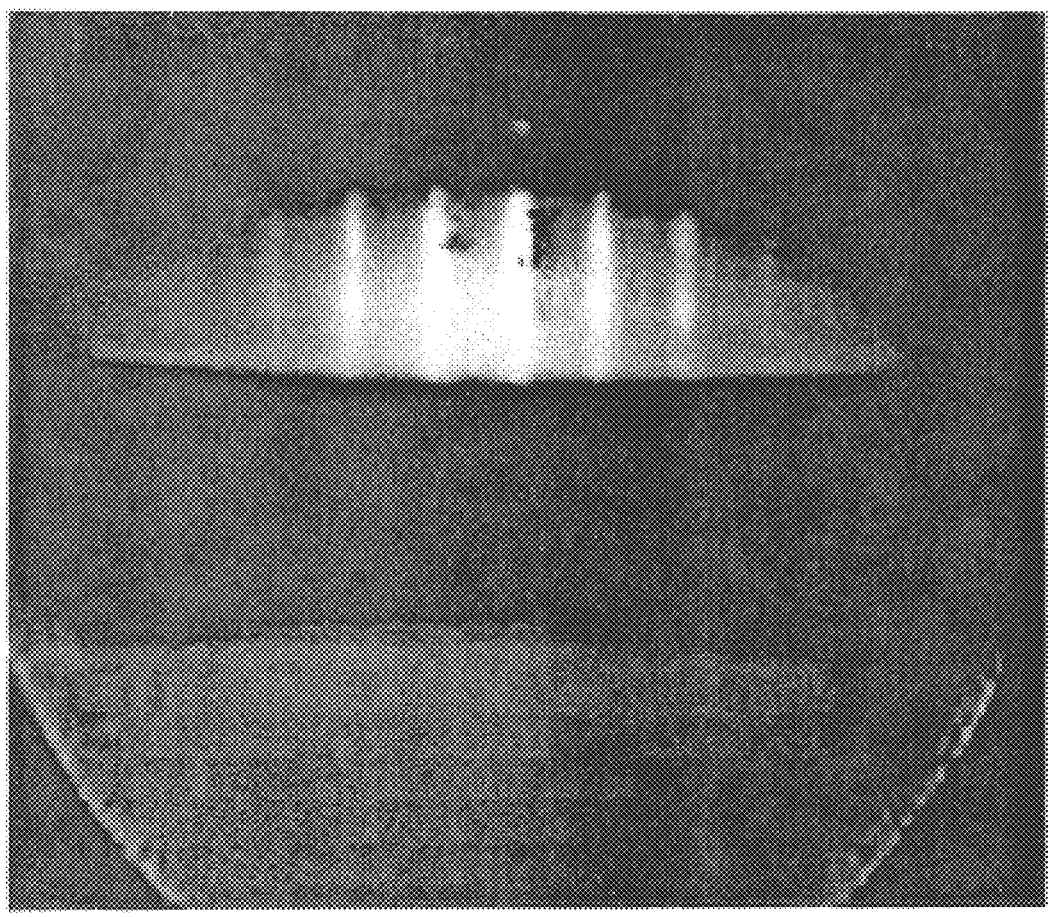
FIG. 5 is a photograph of crystalline structure illustrating a RHEED pattern of a PGT thin film formed on a Pt(001)/BaTiO$_3$(001)/ZrO$_2$(001)/Si(100) structure, as observed when an electron beam is incident from Si [110] direction.
Figure 6:
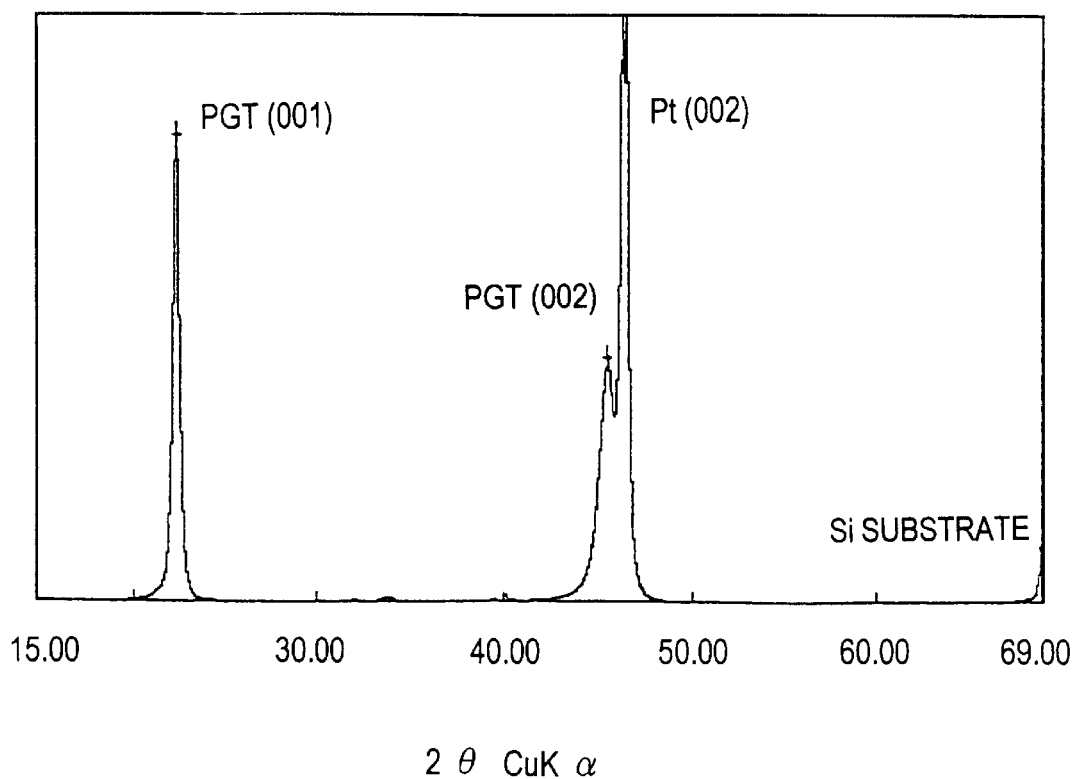
FIG. 6 is a X-ray diffraction diagram of the PGT thin film formed on a Pt(001)/BaTiO$_3$(001)/Zro$_2$(001)/Si(100) structure.

The PGT thin film was also examined by RHEED as in Example 2. FIG. 5 shows a RHEED pattern of the PGT thin film. FIG. 6 shows a X-ray diffraction diagram of the PGT thin film. FIG. 6 where only the peak of c-plane reflection of the perovskite structure of PGT was detected and FIG. 5 where a streaky pattern was observed show that this thin film is a (001) unidirectionally oriented epitaxial film.

Next, after a $ZrO_2$ thin film, a $BaTiO_3$ thin film, and a Pt thin film were formed on a Si substrate as mentioned above, ferroelectric thin films each containing a rare earth element as shown in Table 1 were formed thereon to complete film structure samples. In forming the ferroelectric thin film, lead and titanium were fed in such amounts as to give a $E_{(Pb/Ti)}/F_{(Pb/Ti)}$ ratio in the range between 1.9 and 2.2. In Table 1, the ferroelectric thin films were designated by their abbreviation such as PGT. The aforementioned sample having a PGT thin film is also reported in Table 1. For comparison purposes, a sample of similar construction having a lead titanate (PT) thin film as a ferroelectric thin film was also fabricated. Also fabricated for the purpose of comparison in terms of substrate were samples having a PT thin film or lanthanum-added PT (PLT) thin film on the same substrate as in Example 1, that is, a substrate of MgO having a (001) oriented Pt film thereon. The composition of the ferroelectric thin film of each sample is shown in Table 1.

X-ray diffractometry showed that the ferroelectric thin films of the inventive samples were of perovskite crystals. The inventive samples were of (001) unidirectional orientation except for sample No. 14 (PPT thin film) which was a mixture of (001) orientation and (100) orientation. Additionally, the RHEED patterns of the ferroelectric thin films of the inventive samples were streaky. It is thus evident that the ferroelectric thin film of sample No. 14 had crystal axes well aligned within the film plane despite the mixture of (001) orientation and (100) orientation while the ferroelectric thin films of the remaining inventive samples were epitaxial films.

Figure 14:
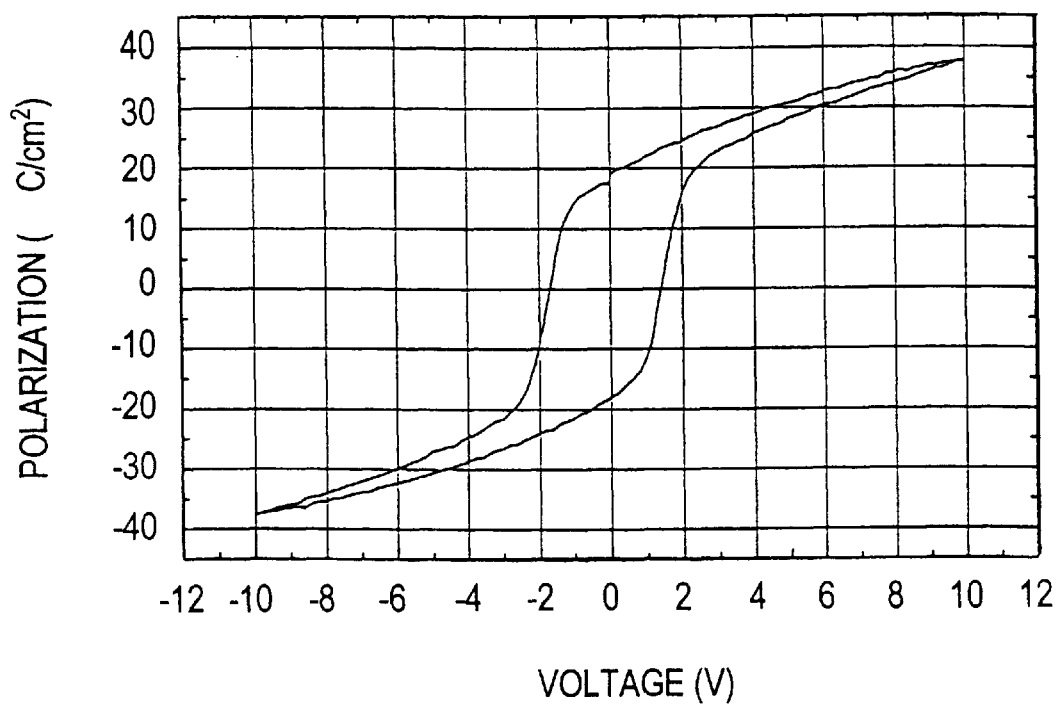
FIG. 14 shows a D-E hysteresis curve of the PPT thin film formed on a Pt(001)/BaTiO$_3$(001)/ZrO$_2$(001)/Si(100) structure.
Figure 15:
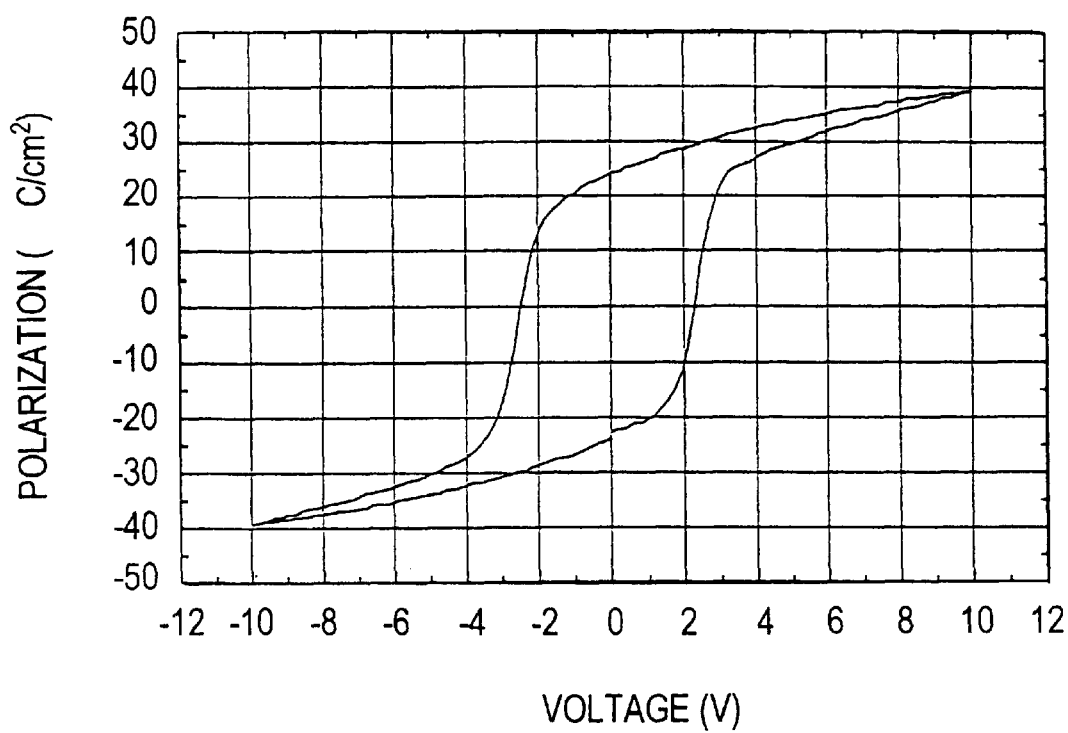
FIG. 15 shows a D-E hysteresis curve of the PGT thin film formed on a Pt(001)/BaTiO$_3$(001)/ZrO$_2$(001)/Si(100) structure.
Figure 16:
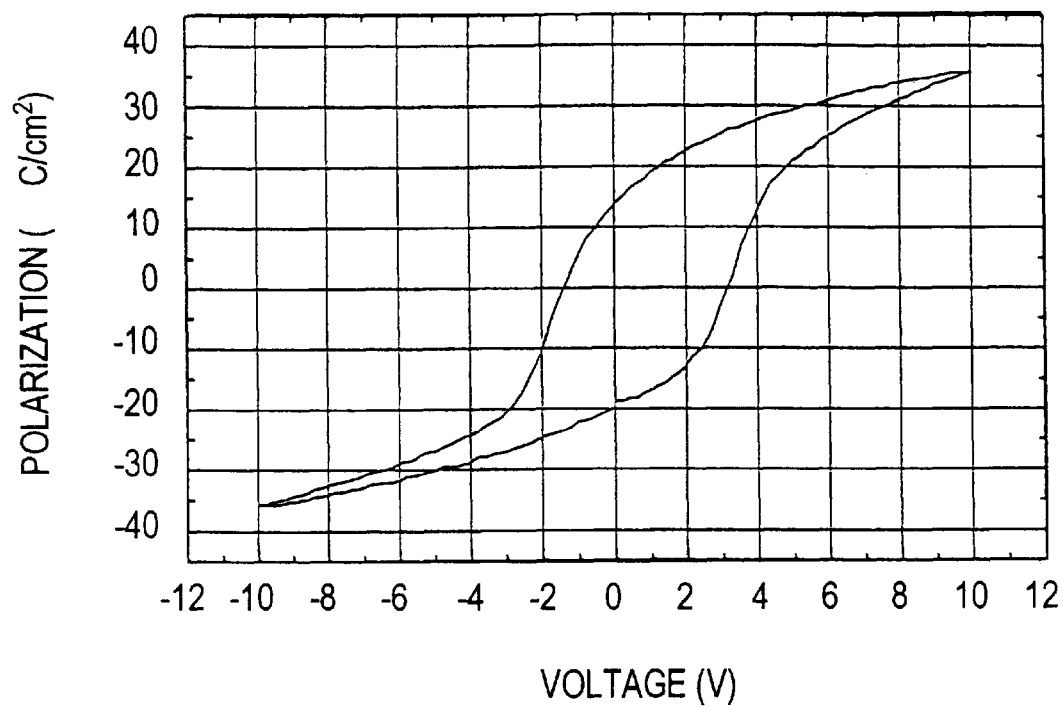
FIG. 16 shows a D-E hysteresis curve of the PTT thin film formed on a Pt(001)/BaTiO$_3$(001)/ZrO$_2$(001)/Si(100) structure.

Pt thin film as the conductive subbing thin film was tapped with a lead wire. Using a tester RT66A (Radiant Technology Co.), the sample was measured for D-E hysteresis. All the inventive samples showed a hysteresis loop, indicating ferroelectric polarization characteristics. As a representative, hysteresis curves of sample No. 2 (PPT thin film), sample No. 6 (PGT thin film), and sample No. 7 (PTT thin film) are shown in FIGS. 14, 15, and 16, respectively. The samples were further measured for residual polarization PR, coercive electric field (polarization reversal voltage) Ec, resistivity of ferroelectric thin film indicative of leak characteristic, and fatigue by polarization reversal. The results are shown in Table 1. It is understood that the fatigue by polarization reversal was determined by measuring an initial polarization PR0 at a bias voltage of 0 volt, repeating $10^{-6}$ cycles of polarization reversal, measuring a final polarization PR1 at a bias voltage of 0 volt, and dividing the latter by the former, that is, PR1/PR0×100%. The fatigue value becomes smaller as the degradation by polarization reversal becomes more serious.

TABLE 1

| Sample No. | Type | Rn | (Pb + Rn)/Ti molar ratio | Pb/(Pb + Rn) atomic ratio | Resistivity ($\Omega$cm) | 2 Ec (V) | 2 Pr ($\mu$C/cm$^2$) | Fatigue (%) |
|---|---|---|---|---|---|---|---|---|
| Inventive samples (Si substrate) | | | | | | | | |
| 1 | PLT | La | 1.03 | 0.89 | $2.02 \times 10^{11}$ | 2.9 | 29 | 72 |
| 2 | PPT | Pr | 1.00 | 0.92 | $1.01 \times 10^{11}$ | 2.8 | 30 | 75 |
| 3 | PNT | Nd | 1.08 | 0.88 | $5.25 \times 10^{10}$ | 3.3 | 49 | 60 |
| 4 | PST | Sm | 1.06 | 0.91 | $1.43 \times 10^{11}$ | 4.1 | 48 | 63 |
| 5 | PET | Eu | 1.13 | 0.91 | $1.40 \times 10^{11}$ | 4.9 | 59 | 65 |
| 6 | PGT | Gd | 1.07 | 0.90 | $6.56 \times 10^{10}$ | 4.2 | 41 | 70 |
| 7 | PTT | Tb | 1.02 | 0.91 | $8.57 \times 10^{10}$ | 3.7 | 23 | 80 |
| 8 | PDT | Dy | 1.15 | 0.88 | $1.70 \times 10^{11}$ | 2.7 | 8.6 | 80 |
| 9 | PHT | Ho | 1.03 | 0.91 | $3.48 \times 10^{10}$ | 3.9 | 26 | 79 |
| 10 | PErT | Er | 1.15 | 0.87 | $8.50 \times 10^{10}$ | 2.7 | 6.8 | 90 |
| 11 | PYbT | Yb | 1.11 | 0.90 | $3.03 \times 10^{10}$ | 1.8 | 3.0 | 90 |
| 12 | PYT | Y | 1.11 | 0.86 | $9.32 \times 10^{10}$ | 2.5 | 8.5 | 90 |
| 13 | PPGT | Pr, Gd | 1.06 | 0.90 | $1.02 \times 10^{11}$ | 2.8 | 31 | 76 |
| 14 | PPT | Pr | 1.02 | 0.96 | $3.86 \times 10^{10}$ | 4.4 | 57.8 | 62 |
| 15 | PPT | Pr | 1.06 | 0.83 | $6.49 \times 10^{11}$ | 0.9 | 4.5 | 78 |
| Comparative samples (Si substrate) | | | | | | | | |
| 16 | PT | nil | 1.06 | 1.0 | $1.99 \times 10^{10}$ | 6.2 | 60 | 45 |
| Comparative samples (MgO substrate) | | | | | | | | |
| 17 | PT | nil | 1.01 | 1.0 | leak | UM | UM | UM |
| 18 | PLT | La | 1.03 | 0.89 | leak | UM | UM | UM |

UM: measurable

Figure 7:
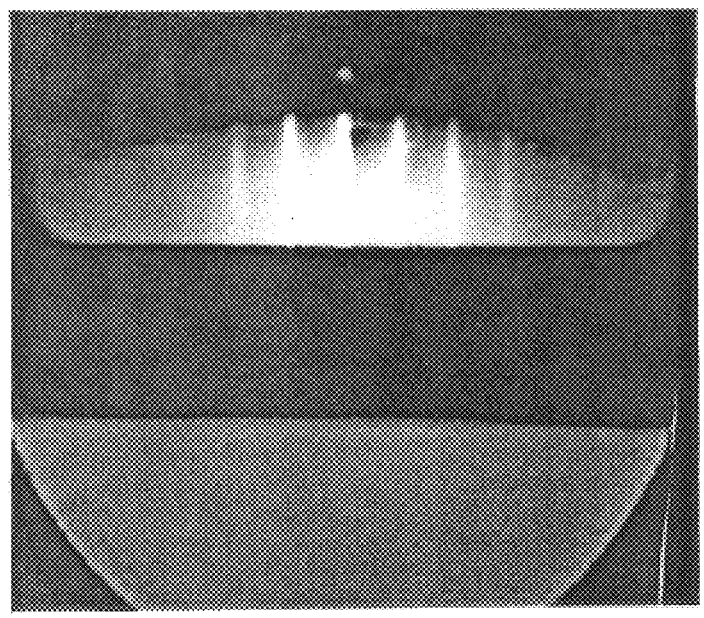
FIG. 7 is a photograph of crystalline structure illustrating a RHEED pattern of a PPT thin film formed on a Pt(001)/BaTiO$_3$(001)/ZrO$_2$(001)/Si(100) structure, as observed when an electron beam is incident from Si [110] direction.
Figure 8:
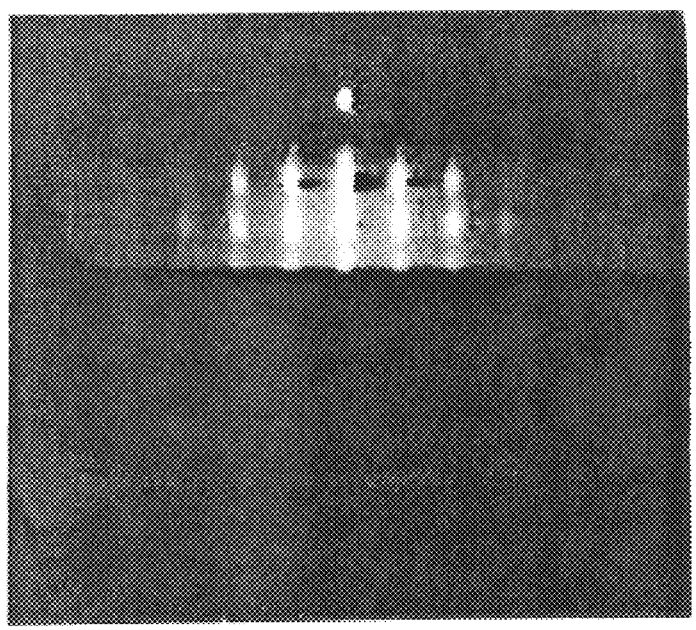
FIG. 8 is a photograph of crystalline structure illustrating a RHEED pattern of a PTT thin film formed on a Pt(001)/BaTiO$_3$(001)/ZrO$_2$(001)/Si(100) structure, as observed when an electron beam is incident from Si [110] direction.
Figure 9:
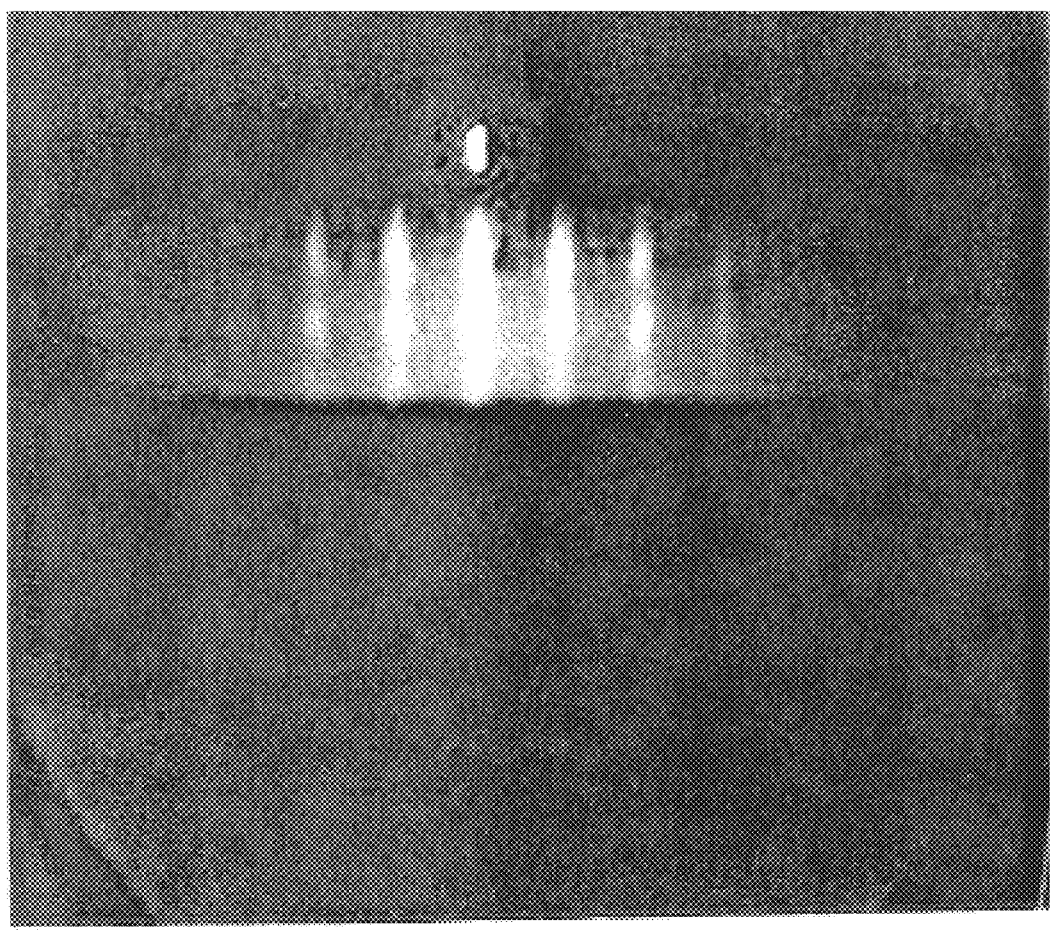
FIG. 9 is a photograph of crystalline structure illustrating a RHEED pattern of a PDT thin film formed on a Pt(001)/BaTiO$_3$(001)/ZrO$_2$(001)/Si(100) structure, as observed when an electron beam is incident from Si [110] direction.
Figure 10:
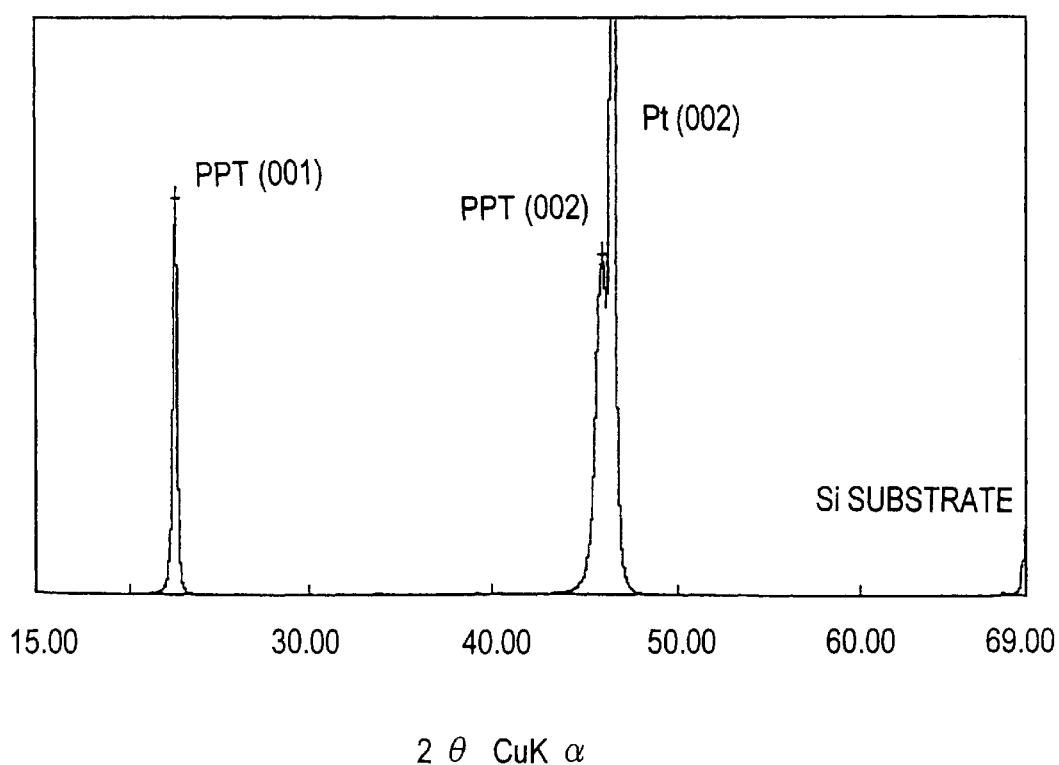
FIG. 10 is a X-ray diffraction diagram of the PPT thin film formed on a Pt(001)/BaTiO$_3$(001)/ZrO$_2$(001)/Si(100) structure.
Figure 11:
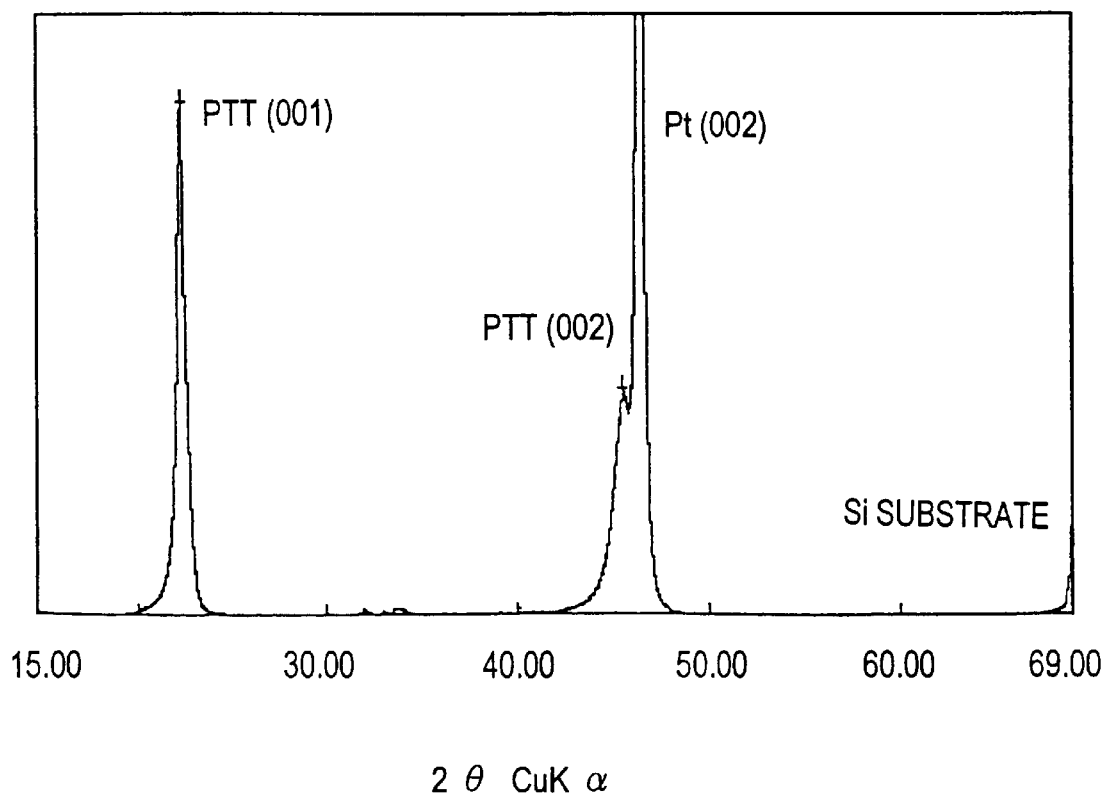
FIG. 11 is a X-ray diffraction diagram of the PTT thin film formed on a Pt(001)/BaTiO$_3$(001)/ZrO$_2$(001)/Si(100) structure.
Figure 12:
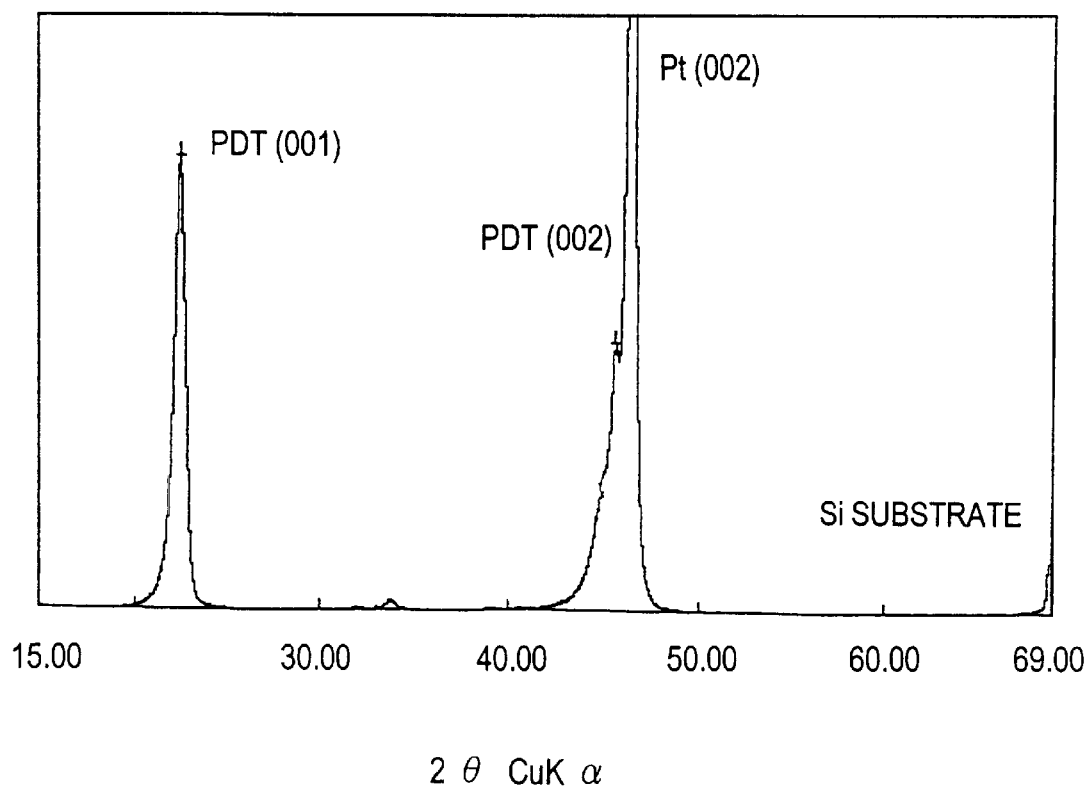
FIG. 12 is a X-ray diffraction diagram of the PDT thin film formed on a Pt(001)/BaTiO$_3$(001)/ZrO$_2$(001)/Si(100) structure.

FIGS. 7 and 10 show a RHEED pattern and a X-ray diffraction diagram of the ferroelectric thin film (PPT thin film) of sample No. 2, respectively. FIGS. 8 and 11 show a RHEED pattern and a X-ray diffraction diagram of the ferroelectric thin film (PTT thin film) of sample No. 7, respectively. FIGS. 9 and 12 show a RHEED pattern and a X-ray diffraction diagram of the ferroelectric thin film (PDT thin film) of sample No. 8, respectively.

Figure 13:
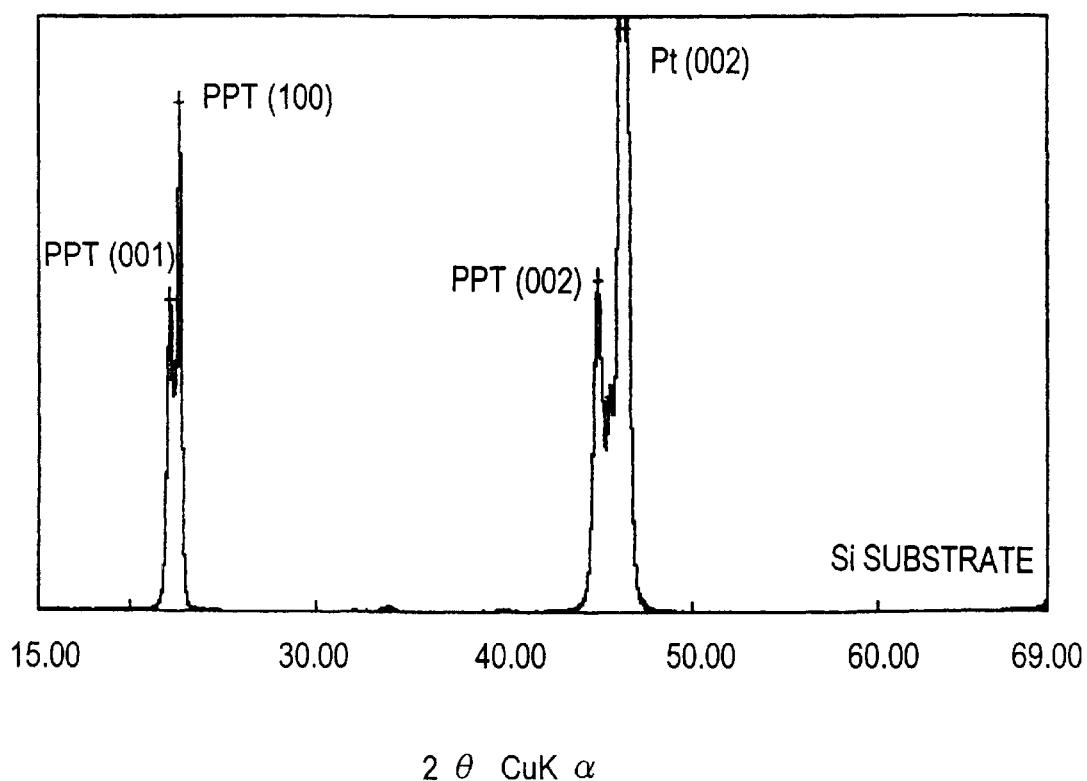
FIG. 13 is a X-ray diffraction diagram of the same PPT thin film as in FIG. 10, but after annealing.

Sample No. 2 (PPT thin film) was annealed in air at 750° C. for 10 minutes. FIG. 13 shows a X-ray diffraction diagram of the ferroelectric thin film as annealed. A comparison of FIG. 10 with FIG. 13 shows that (100) oriented crystals appeared as a result of annealing.

After a Pt electrode having a diameter of 0.11 mm was formed on the surface of the ferroelectric thin film, each sample was annealed in air at 750° C. for 10 minutes. The As is evident from Table 1, the inventive samples having a ferroelectric thin film with a specific are earth element added are successful in reducing Ec, as compared with the comparative sample having a lead titanate thin film free of a rare earth element. The inventive samples have superior leakage and fatigue characteristics to the comparative sample. When a lanthanum-added ferroelectric thin film was formed on a MgO substrate, serious leakage occurred and no ferroelectric characteristics were obtained.

The PT thin film of the comparative example (sample No. 16) in Table 1 had a dielectric constant of 510. The ferroelectric thin films of the inventive samples in Table 1 had a sufficiently low dielectric constant of 196 to 626, which was comparable to or lower than the PT thin film.

Equivalent results were obtained when other metal thin films such as iridium thin films were formed as the conductive subbing thin film.

Equivalent results were obtained when a laminate of a ZrO$_2$ thin film and a rare earth oxide thin film was used as the intermediate thin film.

The film structure samples fabricated in the foregoing Examples were embodied as recording media, on which data could be recorded and retrieved by an AFM probe.

There has been described a film structure having a ferroelectric thin film of lead family ferroelectric material with a specific rare earth element added. It can be applied as non-volatile memories, IR sensors, optical modulators, optical switches, OEICs and recording media by utilizing its excellent ferroelectric characteristics. It is best suited as gate type non-volatile memories of the MFIS or MFMIS structure and recording media of the type wherein information is recorded by an AFM probe.

The method of the invention enables to form a thin film having improved ferroelectric characteristics. A lead family ferroelectric thin film of quality can be formed over a large area of more than 2 inches in diameter under easily controllable conditions leaving no room for impurity inclusion and in a reproducible manner. Additionally, such a thin film can be formed on silicon substrates which are important for semiconductor applications. The inventive method is thus of industrially great value.

Although some preferred embodiments have been described, many modifications and variations may be made thereto in the light of the above teachings. It is therefore to be understood that within the scope of the appended claims, the invention may be practiced otherwise than as specifically described.

What is claimed is:

1. A process for preparing a ferroelectric thin film of oxides containing at least Pb and Ti on a substrate by a multi-source evaporation method, comprising the steps of:

placing at least lead oxide and TiOx wherein $1 \leq x \leq 1.9$ as sources in an evaporation chamber, and evaporating the sources in the chamber while introducing an oxidizing gas therein.

2. The process of claim 1 wherein the evaporating step is controlled such that the atomic ratio of Pb/Ti elements supplied from the sources represented by $E_{(Pb/Ti)}$ and the atomic ratio of Pb/Ti elements in the ferroelectric thin film represented by $F_{(Pb/Ti)}$ satisfy the relationship: $1.5 \leq E_{(Pb/Ti)}/F_{(Pb/Ti)} \leq 3.5$.

3. The process of claim 1 wherein the oxidizing gas is a partially radical oxygen.

4. The process of claim 1 wherein the substrate is heated at a temperature of 500 to 700° C. during the evaporating step.

5. The process of claim 1 wherein the ferroelectric thin film further contains at least one element selected from the group consisting of Zr, Nb, Ta, Hf, and Ce.

6. A process for preparing a film structure comprising a substrate and a ferroelectric thin film formed on one surface of said substrate, wherein said ferroelectric thin film contains R$_1$ which is at least one rare earth element selected from the group consisting of Pr, Nd, Eu, Tb, Dy, Ho, Yb, Y, Sm, Gd, and Er, lead, titanium, and oxygen in an atomic ratio in the range:

$0.8 \leq (Pb+R_1)/Ti \leq 1.3$ and $0.5 \leq Pb/(Pb+R_1) \leq 0.99$, has a perovskite type crystal structure, and is of (001) unidirectional orientation or a mixture of (001) orientation and (100) orientation, wherein said process comprises a step comprising carrying out the process of claim 1.

7. The process of claim 1 wherein $1 \leq x \leq 1.9$.
8. The process of claim 7 wherein $1 \leq x \leq 1.8$.
9. The process of claim 8 wherein $1.5 \leq x \leq 1.75$.
10. The process of claim 9 wherein $1.65 \leq x \leq 1.75$.

* * * * *